(12) United States Patent
Choi et al.

(10) Patent No.: US 10,963,083 B2
(45) Date of Patent: *Mar. 30, 2021

(54) DISPLAY APPARATUS AND METHOD OF MANUFACTURING THE SAME

(71) Applicant: Samsung Display Co., Ltd., Yongin-si (KR)

(72) Inventors: Wonsuk Choi, Yongin-si (KR); Sangmin Kim, Yongin-si (KR); Sunghoon Kim, Yongin-si (KR); Cheolsu Kim, Yongin-si (KR); Yoonsun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/699,073

(22) Filed: Nov. 28, 2019

(65) Prior Publication Data

US 2020/0097116 A1 Mar. 26, 2020

Related U.S. Application Data

(63) Continuation of application No. 16/378,369, filed on Apr. 8, 2019, now Pat. No. 10,528,170, which is a
(Continued)

(30) Foreign Application Priority Data

Mar. 11, 2016 (KR) .......................... 10-2016-0029716
Aug. 29, 2016 (KR) .......................... 10-2016-0110091

(51) Int. Cl.
*G06F 3/044* (2006.01)
*G06F 3/041* (2006.01)
(Continued)

(52) U.S. Cl.
CPC ........ *G06F 3/0412* (2013.01); *G06F 3/04164* (2019.05); *H01L 27/1218* (2013.01);
(Continued)

(58) Field of Classification Search
CPC ......... G06F 2203/04103; G06F 3/0412; G06F 3/0416; G06F 3/044; H01L 2227/323;
(Continued)

(56) References Cited

U.S. PATENT DOCUMENTS 8,582,049 B2 11/2013 Shim et al.
8,791,455 B2 7/2014 Kim et al.
(Continued)

FOREIGN PATENT DOCUMENTS

CN 104521331 4/2015
EP 2985684 2/2016
(Continued)

OTHER PUBLICATIONS

European Extended Search Report dated Jul. 18, 2017, in European Patent Application No. 17159557.2.
(Continued)

*Primary Examiner* — Tony O Davis
(74) *Attorney, Agent, or Firm* — H.C. Park & Associates, PLC

(57) ABSTRACT

A display apparatus including a substrate having a display area in which a display device is provided to display an image, and a non-display area around the display area. The non-display area includes a bending area that is bent about a bending axis; an encapsulation layer arranged above the display area; a touch electrode arranged above the encapsulation layer; a touch wire connected to the touch electrode and extending to the non-display area; and a fan-out wiring connected to a signal wiring that applies electric signals to the display area. At least a portion of the fan-out wiring is
(Continued)

arranged in the bending area, and the fan-out wiring includes the same material as the touch wire.

13 Claims, 31 Drawing Sheets

Related U.S. Application Data continuation of application No. 15/452,891, filed on Mar. 8, 2017, now Pat. No. 10,268,296.

(51) Int. Cl.
    *H01L 27/12* (2006.01)
    *H01L 51/00* (2006.01)
    *H01L 27/32* (2006.01)
    *H01L 51/52* (2006.01)
    *H01L 51/56* (2006.01)

(52) U.S. Cl.
    CPC ...... *H01L 27/3246* (2013.01); *H01L 27/3258* (2013.01); *H01L 27/3262* (2013.01); *H01L 27/3279* (2013.01); *H01L 51/0097* (2013.01); *H01L 51/5253* (2013.01); *H01L 51/56* (2013.01); *G06F 3/044* (2013.01); *G06F 2203/04103* (2013.01); *H01L 27/124* (2013.01); *H01L 27/1248* (2013.01); *H01L 27/323* (2013.01); *H01L 51/5246* (2013.01); *H01L 2227/323* (2013.01); *H01L 2251/5338* (2013.01); *Y02E 10/549* (2013.01)

(58) Field of Classification Search
    CPC ......... H01L 2251/5338; H01L 27/1218; H01L 27/124; H01L 27/1248; H01L 27/323; H01L 27/3246; H01L 27/3258; H01L 27/3262; H01L 27/3279; H01L 51/0097; H01L 51/5246; H01L 51/5253; H01L 51/56; Y02E 10/549
    USPC .................................................. 345/170–178
    See application file for complete search history.

(56) References Cited

U.S. PATENT DOCUMENTS

| | | | |
|---|---|---|---|
| 9,323,400 B2 | 4/2016 | Kim et al. | |
| 9,383,849 B2 | 7/2016 | Hur | |
| 9,419,065 B2 | 8/2016 | Degner et al. | |
| 10,268,296 B2 * | 4/2019 | Choi | G06F 3/0416 |
| 10,528,170 B2 * | 1/2020 | Choi | H01L 27/3262 |
| 2010/0134426 A1 | 6/2010 | Lee et al. | |
| 2011/0273075 A1 | 11/2011 | Goto et al. | |
| 2012/0249436 A1 * | 10/2012 | Choi | G06F 3/0412 |
| | | | 345/173 |
| 2013/0021289 A1 | 1/2013 | Chen et al. | |
| 2014/0055702 A1 | 2/2014 | Park et al. | |
| 2014/0062944 A1 * | 3/2014 | Wang | G06F 3/044 |
| | | | 345/174 |
| 2014/0232956 A1 | 8/2014 | Kwon et al. | |
| 2015/0138146 A1 | 5/2015 | Hong | |
| 2015/0212548 A1 | 7/2015 | Namkung et al. | |
| 2016/0035812 A1 | 2/2016 | Kwon et al. | |
| 2016/0041644 A1 | 2/2016 | Bae et al. | |
| 2016/0048248 A1 | 2/2016 | Na et al. | |
| 2016/0149164 A1 | 5/2016 | Lee | |
| 2016/0170509 A1 * | 6/2016 | Notermans | G06F 3/041 |
| | | | 345/173 |
| 2016/0172428 A1 | 6/2016 | Song | |
| 2017/0256739 A1 * | 9/2017 | Kim | G02F 1/133308 |
| 2017/0262109 A1 * | 9/2017 | Choi | G06F 3/0412 |
| 2019/0235682 A1 * | 8/2019 | Choi | G06F 3/0412 |
| 2020/0097116 A1 * | 3/2020 | Choi | G06F 3/0412 |

FOREIGN PATENT DOCUMENTS

| | | |
|---|---|---|
| KR | 10-2012-0060926 | 6/2012 |
| KR | 10-2012-0063748 | 6/2012 |
| KR | 10-2014-0045193 | 4/2014 |
| KR | 10-2014-0096507 | 8/2014 |
| KR | 10-2015-0061769 | 6/2015 |

OTHER PUBLICATIONS

Non-Final Office Action dated Aug. 1, 2018 issued in U.S. Appl. No. 15/452,891.

Notice of Allowance dated Dec. 10, 2018 issued in U.S. Appl. No. 15/452,891.

Non-Final Office Action dated May 15, 2019 issued in U.S. Appl. No. 16/378,369.

Notice of Allowance dated Aug. 28, 2019 issued in U.S. Appl. No. 16/378,369.

\* cited by examiner

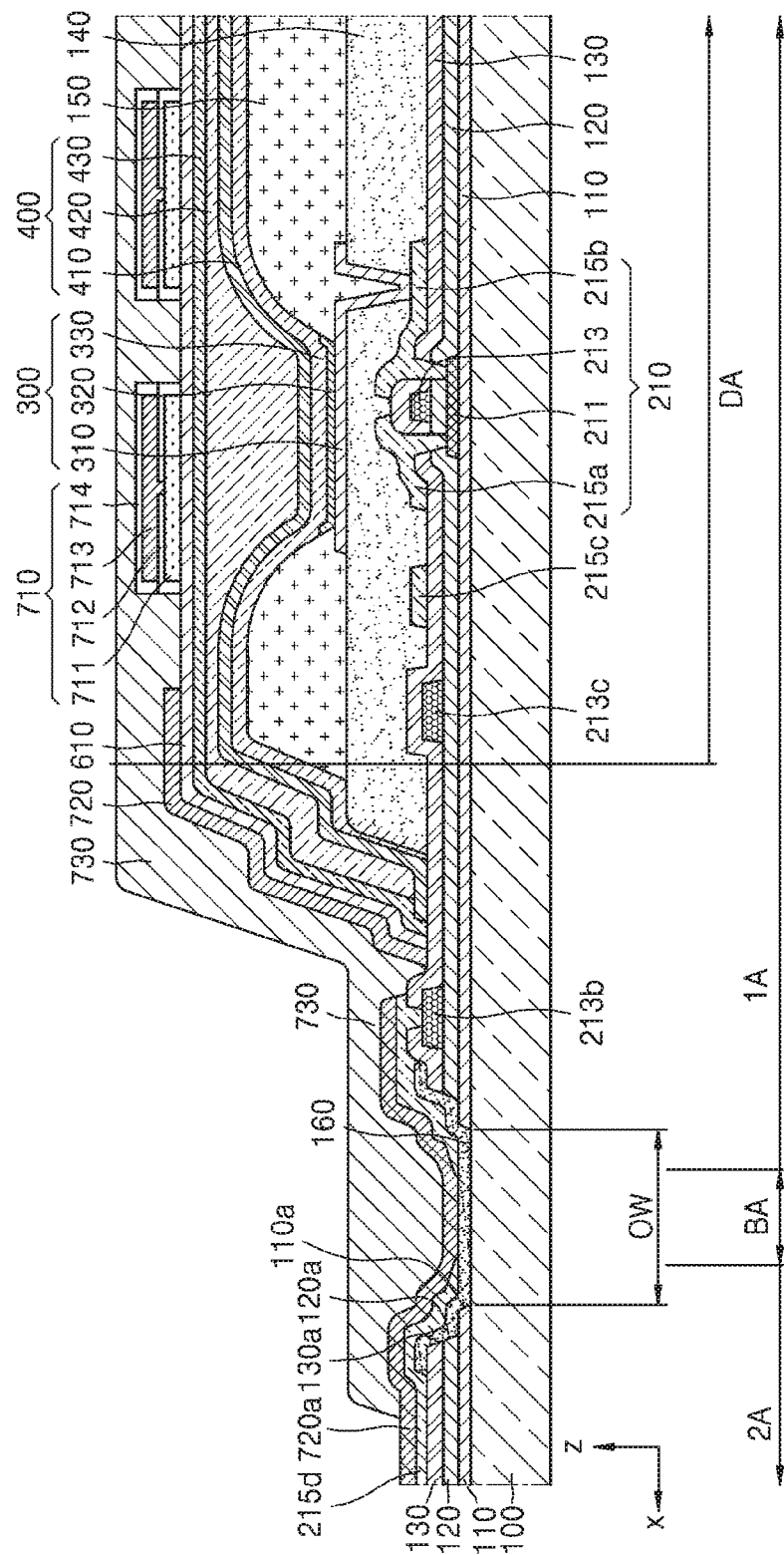

DISPLAY APPARATUS AND METHOD OF MANUFACTURING THE SAME

CROSS-REFERENCE TO RELATED APPLICATIONS

This application is a continuation of U.S. patent application Ser. No. 16/378,369, filed on Apr. 8, 2019, which is a continuation of U.S. patent application Ser. No. 15/452,891, filed on Mar. 8, 2017, now issued as U.S. Pat. No. 10,268,296, and claims priority from and the benefit of Korean Patent Application No. 10-2016-0029716, filed on Mar. 11, 2016, and Korean Patent Application No. 10-2016-0110091, filed on Aug. 29, 2016, each of which is hereby incorporated by reference for all purposes as if fully set forth herein.

BACKGROUND

Field

Exemplary embodiments relate to a display apparatus and a method of manufacturing the same.

Discussion of the Background

A display apparatus, which visually displays data, includes a substrate divided into a display area and a non-display area. In the display area, gate lines and data lines are insulated from each other, and a plurality of pixel areas are defined by crossing the gate lines and the data lines. Also, in the display area, thin film transistors (TFTs) and pixel electrodes electrically connected to the TFTs are provided in correspondence with the pixel areas. The non-display area includes a pad and a fan-out unit. The fan-out unit includes wires that connect the pad to the display area and through which signals from a driver integrated circuit (IC) provided on the pad are transmitted.

At least a portion of the display apparatus may be bent to enhance visibility in various angles or decrease the size of the non-display area. Various techniques for reducing costs and the occurrence of defects during the manufacturing of bent display apparatuses are being developed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display apparatus with increased durability, low manufacturing costs. Various defects, such as short-circuits, that may be created during the various manufacturing processes, may be prevented in the exemplary embodiments. The exemplary embodiments also include a method of manufacturing the display apparatus.

Additional aspects will be set forth in part in the description which follows and, in part, will be apparent from the disclosure, or may be learned by practice of the inventive concept.

An exemplary embodiment discloses a display apparatus including: a substrate including a display area in which a display device is provided to display an image, and a non-display area disposed around the display area, wherein the non-display area includes a bending area that is bent about a bending axis; an encapsulation layer arranged above the display area; a touch electrode arranged above the encapsulation layer; a touch wire connected to the touch electrode and extending to the non-display area; and a fan-out wiring connected to a signal wiring that applies electric signals to the display area. At least a portion of the fan-out wiring is arranged in the bending area, and the fan-out wiring includes the same material as the touch wire.

An exemplary embodiment also discloses a display apparatus including: a substrate including a display area in which a display device is provided to display an image, and a non-display area disposed around the display area, wherein the non-display area may include a bending area that is bent about a bending axis; an encapsulation layer arranged above the display area; a touch electrode arranged above the encapsulation layer; a touch wire connected to the touch electrode and extending to the non-display area; a signal wiring arranged between the bending area and the display area and applying electric signals; a terminal arranged in one side of the non-display area; and a fan-out wiring at least partially arranged in the bending area and having one side connected to the signal wiring through a via hole and another side connected to the terminal. The fan-out wiring may include the same material as the touch wire.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 4G is a cross-sectional view schematically illustrating a portion of a display apparatus according to an exemplary embodiment.

DETAILED DESCRIPTION OF THE ILLUSTRATED EMBODIMENTS

Figure 1:
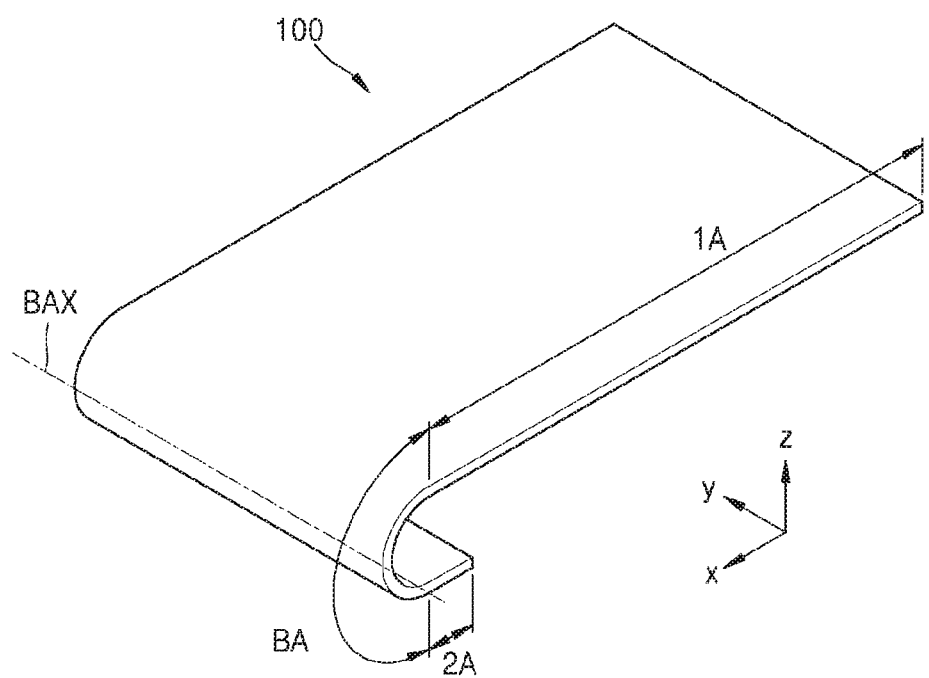
FIG. 1 is a perspective view schematically illustrating a portion of a display apparatus, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

A display apparatus is an apparatus for displaying images, for example, a liquid crystal display (LCD) apparatus, an electrophoretic display apparatus, an organic light-emitting display apparatus, an inorganic light-emitting display apparatus, a field emission display (FED) apparatus, a surface-conduction electron-emitter (SED) display apparatus, a plasma display apparatus, a cathode ray display apparatus, or the like.

Hereinafter, an organic light-emitting display apparatus is described as an example of a display apparatus according to an exemplary embodiment. However, the display apparatus is not limited thereto, and the display apparatus may include various types of display apparatuses.

Figure 2A:
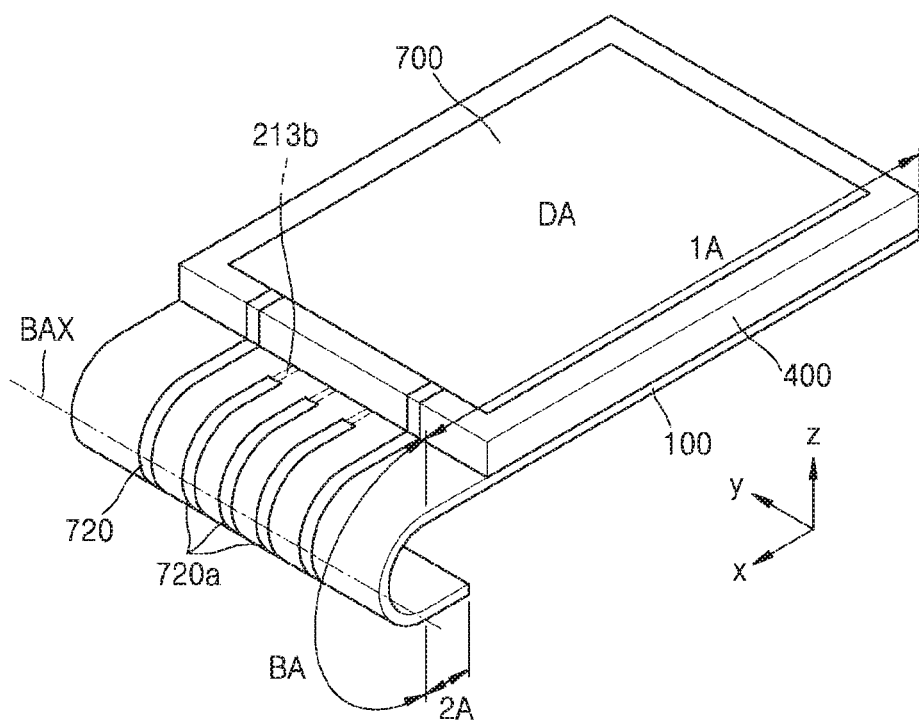
FIG. 2A is a perspective view schematically illustrating a portion of a display apparatus, according to an exemplary embodiment.
Figure 2B:
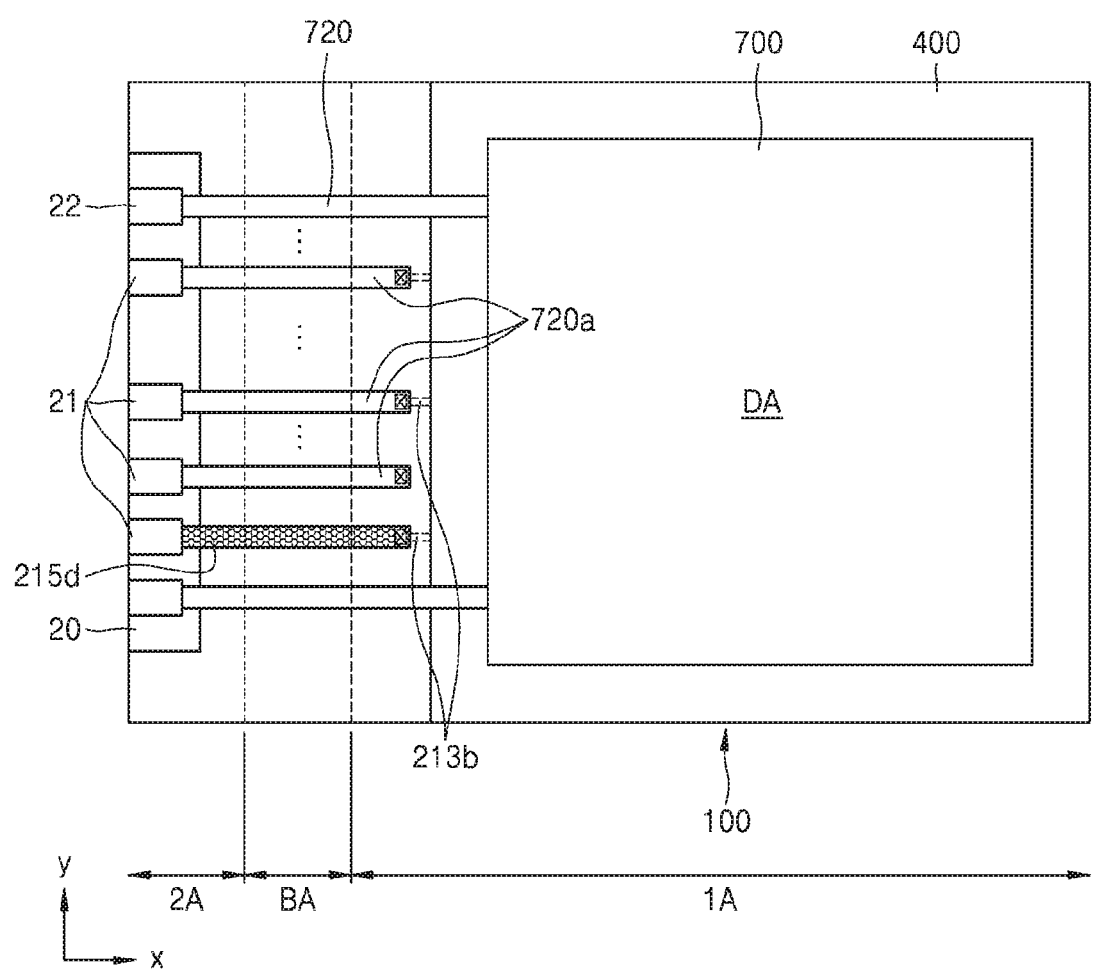
FIG. 2B is a plan view schematically illustrating a portion of a display apparatus, according to an exemplary embodiment.
Figure 2C:
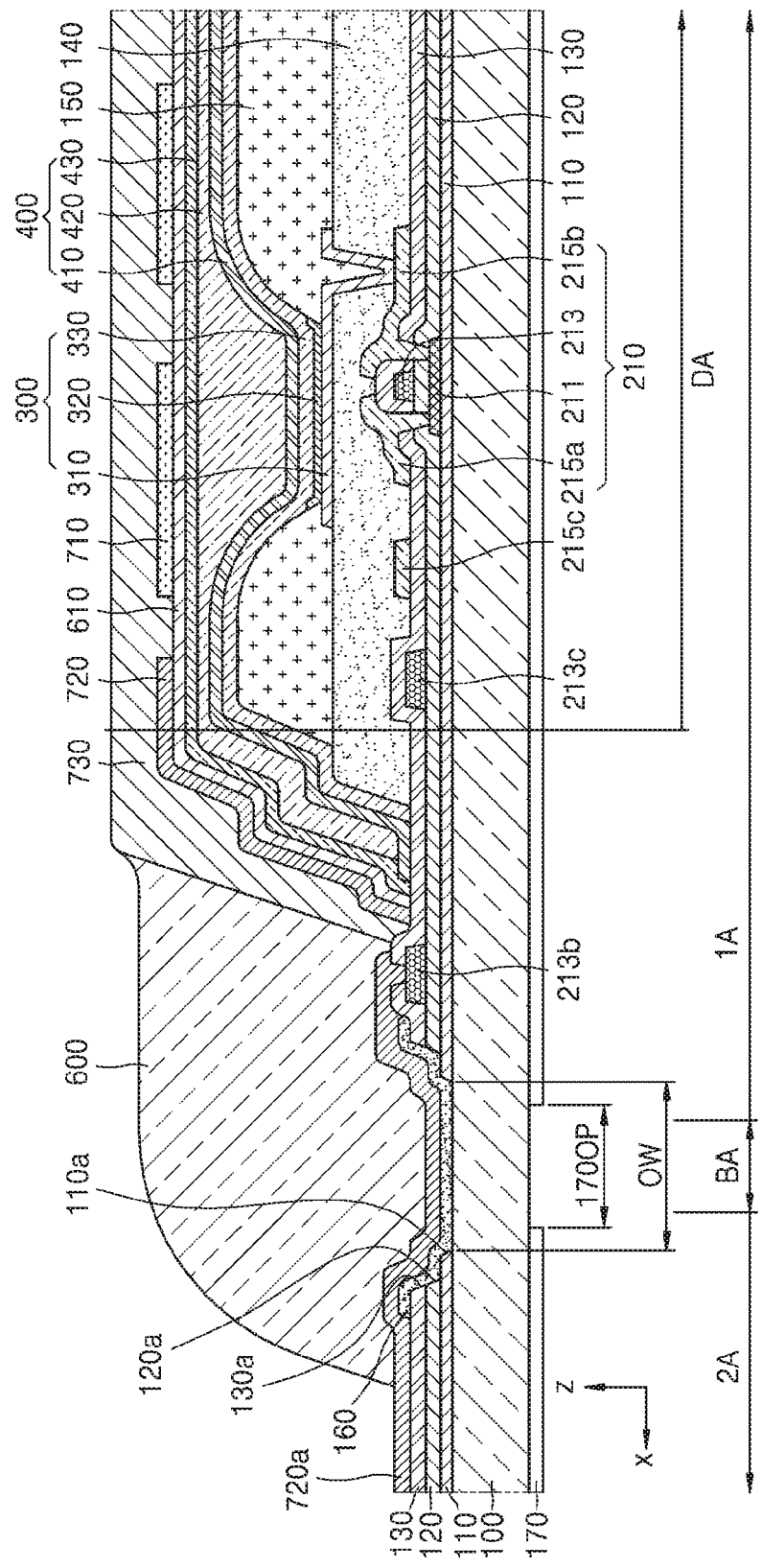
FIG. 2C is a cross-sectional view schematically illustrating a portion of the display apparatus of FIG. 2A.

FIGS. 1 and 2A are perspective views schematically illustrating a portion of a display apparatus, according to an exemplary embodiment. FIG. 2B is a plan view schematically illustrating a portion of a display apparatus, according to an exemplary embodiment. FIG. 2C is a cross-sectional view schematically illustrating a portion of the display apparatus of FIG. 2A. As shown in FIG. 1, a portion of the display apparatus according to the present exemplary embodiment is bent because a substrate 100 in the display apparatus is partially bent. For convenience of description, FIG. 2C illustrates the display apparatus in a non-bent state. Cross-sectional views and plan views related to the exemplary embodiments disclosed below also illustrate the display apparatus in a non-bent state for convenience of description.

As shown in FIGS. 1 through 2C, the substrate 100 of the display apparatus according to the present exemplary embodiment is divided into a display area DA, in which a display device is provided and images are displayed, and a non-display area around the display area DA. The non-display area includes a bending area BA that is bent about a bending axis BAX. The bending area BA may refer to a bent area having a radius of curvature.

The bending area BA extends in a first direction (+y direction) and is arranged between a first area 1A and a second area 2A in a second direction (+x direction) that intersects the first direction. Also, the substrate 100 is bent about the bending axis BAX that extends in the first direction (+y direction), as shown in FIG. 1. The substrate 100 may include various flexible or bendable materials, for example, a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The first area 1A includes the display area DA. Other than the display area DA, the first area 1A may also include a portion of the non-display area around or outside the display area DA, as shown in FIG. 2C. The second area 2A also includes the non-display area.

A plurality of pixels that display images may be provided in the display area DA of the substrate 100. The display area DA may include, for example, a display device 300, a thin film transistor (TFT) 210, and a capacitor Cst (not shown).

Referring to FIGS. 2A through 2C, the display area DA may further include a signal wiring including a gate line through which gate signals are transmitted, a data line through which data signals are transmitted, etc. that transfers a pulse signal and a direct current signal such as a driving power line, a common power line, etc (all not shown). A pixel may be formed and display an image based on an electric combination of the TFT, the capacitor, the display device, and the like connected to the gate line, the data line, and the driving power line. The brightness of the pixel may correspond to a driving current passing through the display device in response to the data signals according to the driving power and the common power supplied to the pixel. The signal wiring may be connected to a terminal unit 20 through a fan-out wiring 720a. That is, the fan-out wiring 720a may transfer a pulse signal such as a gate signal, a data signal, etc. and a direct current such as power, etc. A plurality of pixels may be provided and arranged in various ways, such as a stripe layout, a PenTile™ layout, or the like.

The terminal unit 20, the fan-out wiring 720a, an additional conductive layer 215d, and a touch wire 720 may be arranged in the non-display area. Although not shown, a common power line, a driving power line, a gate driving unit, a data driving unit, etc. may be further arranged in the non-display area.

The terminal unit 20 may be arranged in one end of the non-display area and may include a signal terminal 21 and a touch terminal 22. The terminal unit 20 may not be covered by an insulating layer but may be exposed so that the terminal unit 20 may be electrically connected to a driving circuit unit (not shown) such as a flexible printed circuit board (FPCB), a driver IC, etc. A control unit may provide a data signal, a gate signal, a driving voltage DLVDD, a common voltage ELVSS, etc. The control unit may also provide a signal to a touch screen layer 700 through the touch wire 720 or may receive a signal sensed by the touch screen layer 700.

The fan-out wiring 720a is in the non-display area and connected to a TFT 210 in the display area DA or the first signal wiring 213b that applies electric signals to the display device 300. As described above, the first signal wiring 213b may correspond to various lines provided in the display area DA, such as the gate line, the data line, the driving power line, the common power line, or the like. The fan-out wiring 720a may be connected to the first signal wiring 213b and at least a portion of the fan-out wiring 720a may be in the bending area BA. In some embodiments, the fan-out wiring 720a may extend from the first area 1A and be in a portion of the bending area BA, or extend across the bending area BA until the second area 2A. That is, the fan-out wiring 720a may extend across the bending axis BAX. For example, the fan-out wiring 720a may have various modifications, such as the fan-out wiring 720a may extend at a predetermined inclined angle with the bending axis BAX. The fan-out wiring 720a may have various shapes, such as a curved shape, a zigzag shape, etc. (other than a straight line shape).

The fan-out wiring 720a may be connected to the signal terminal 21 of the terminal unit 20 to transfer an electrical signal to the display area DA.

The additional conductive layer 215d may be further provided in the non-display area. The additional conductive layer 215d may be connected to a signal line applying an electrical signal to the TFT 210 or the display device 300 arranged in the display area DA, such as the fan-out wiring 720a. The additional conductive layer 215d may include a material different from the fan-out wiring 720a. For example, the additional conductive layer 215d may include the same material as a gate line or a data line that is an internal signal line of the display area DA. The additional conductive layer 215d may be arranged in a different layer from the fan-out wiring 720a and, as shown in FIG. 2B, and may be horizontally spaced apart from the fan-out wiring 720a. However, the arrangement of the additional conductive layer 215d is not limited thereto. The additional conductive layer 215d may at least partially overlap with the fan-out wiring 720a. For example, the additional conductive layer 215d may be electrically connected to the fan-out wiring 720a in a lower portion of the fan-out wiring 720a to apply an electrical signal to the display area DA. Another exemplary embodiment regarding a layout of the additional conductive layer 215d and the fan-out wiring 720a will be described below.

The display apparatus according to the present exemplary embodiment may include a signal wiring 213b connected to the fan-out wiring 720a, in addition to the fan-out wiring 720a. The signal wiring 213b may be arranged in the first area 1A or the second area 2A in order to be located in a layer different from a layer in which the fan-out wring 720a, and may be electrically connected to the fan-out wring 720a.

The signal wiring 213b may be electrically connected to a TFT 210 included in the display area DA and thus, the fan-out wiring 720a may be electrically connected to the TFT 210 included in the display area DA through the signal wiring 213b. As such, the signal wiring 213b may be located outside the display area DA while electrically connected to components located in the display area DA, may be located outside the display area DA while extending in a direction of the display area DA, and thus, the signal wiring 213b may be at least partially located in the display area DA.

The display area DA may be sealed by an encapsulation layer 400. The encapsulation layer 400 may cover the display device 300 and other elements in the display area DA and protect the display device 300 and other elements from external moisture or oxygen. The encapsulation layer 400 may cover the display area DA and partially extend to an outer portion of the display area DA.

On the encapsulation layer 400, the touch screen layer 700 including a touch electrode 710 with various patterns for a touch screen function is provided. The touch electrode 710 may be connected to the touch wire 720 through which signals detected by the touch electrode 710 are transmitted. The touch wire 720 may extend from an upper portion of the encapsulation layer 400 to the non-display area along a side of the encapsulation layer 400. The touch wire 720 may be connected to the touch screen layer 700, and extend from the upper portion of the encapsulation layer 400 until at least a portion of the touch wire 720 is in the bending area BA.

FIG. 2C illustrates an organic light-emitting device 300 in the display area DA. The organic light-emitting device 300 being electrically connected to the TFT 210 may indicate that a pixel electrode 310 is electrically connected to the TFT 210. If necessary, another TFT (not shown) may be provided in a surrounding area outside the display area DA of the substrate 100. The TFT provided in the surrounding area may be, for example, a portion of a circuit unit for controlling electric signals applied to the display area DA.

The TFT 210 may include a semiconductor layer 211 including non-amorphous silicon, polycrystalline silicon, an oxide semiconductor material, or an organic semiconductor material. The TFT 210 may also include a gate electrode 213, a source electrode 215a, and a drain electrode 215b.

The gate electrode 213 may be connected to a gate line (not shown) that applies on and off signals to the TFT 210. The gate electrode 213 may include a low-resistive metallic material. For example, the gate electrode 213 may be a single layer or layers formed of a conductive material including, for example, molybdenum (Mo), aluminum (Al), copper (Cu), and/or titanium (Ti).

Each of the source electrode 215a and the drain electrode 215b may be a single layer or layers including a conductive material. The source electrode 215a and the drain electrode 215b may be respectively connected to a source area and a drain area of the semiconductor layer 211. For example, each of the source electrode 215a and the drain electrode 215b may be a single layer or layers formed of a conductive material including, for example, Al, Cu, and/or Ti.

The TFT 210 according to an exemplary embodiment may be a top gate type TFT in which the gate electrode 213 is above the semiconductor layer 211. However, other exemplary embodiments of the TFT 210 are not limited thereto. The TFT 210 according to another exemplary embodiment may be a bottom gate type TFT in which the gate electrode 213 is under the semiconductor layer 211.

In order to insulate the semiconductor layer 211 from the gate electrode 213, a gate insulating layer 120 may be provided between the semiconductor layer 211 and the gate electrode 213, the gate insulating layer 120 including an inorganic material, such as silicon oxide, silicon nitride, and/or silicon oxynitride. In addition, an interlayer insulating layer 130 may be provided above the gate electrode 213, the interlayer insulating layer 130 including an inorganic material such as silicon oxide, silicon nitride, and/or silicon oxynitride. The source electrode 215a and the drain electrode 215b may be provided above the interlayer insulating layer 130. An insulating layer including an inorganic material may be formed through chemical vapor deposition (CVD) or atomic layer deposition (ALD). This also applies to exemplary embodiments described below and modified examples of the exemplary embodiments.

A buffer layer 110 may be provided between the TFT 210 and the substrate 100, the buffer layer 110 including an inorganic material such as silicon oxide, silicon nitride, and/or silicon oxynitride. The buffer layer 110 may planarize an upper surface of the substrate 100 or prevent impurities from the substrate 100 penetrating into the semiconductor layer 211 of the TFT 210. The buffer layer 110 may have a single layer structure or a multiple layer structure.

A planarization layer 140 may be disposed above the TFT 210. For example, as shown in FIG. 2C, when the organic light-emitting device 300 is provided above the TFT 210, the planarization layer 140 may planarize an upper portion of a protection layer that covers the TFT 210. The planarization layer 140 may include an organic material, for example, PI, acryl, benzocyclobutene (BCB), or hexamethyldisiloxane (HMDSO). Although FIG. 2C illustrates the planarization layer 140 as a single layer, the planarization layer 140 may be layers or modified in other various ways.

In the display area DA of the substrate 100, the organic light-emitting device 300 may be disposed on the planarization layer 140. The organic light-emitting device 300 may include the pixel electrode 310, an opposite electrode 330, and an intermediate layer 320 that is provided between the pixel electrode 310 and the opposite electrode 330 and includes an emission layer. As shown in FIG. 2C, the pixel electrode 310 may be electrically connected to the TFT 210 by contacting any one of the source electrode 215a and the drain electrode 215b through an opening formed in the planarization layer 140.

A pixel defining layer 150 may be disposed above the planarization layer 140. The pixel defining layer 150 defines a pixel with openings that respectively correspond to sub-pixels, i.e., openings that expose at least a central portion of the pixel electrode 310. In FIG. 2C, the pixel defining layer 150 on the pixel electrode 310 may increase a distance between a periphery of the pixel electrode 310 and the opposite electrode 330 so that an arc is not created at the periphery of the pixel electrode 310. The pixel defining layer 150 may include, for example, PI, acryl, BCB, or HMDSO.

The intermediate layer 320 of the organic light-emitting device may include a low molecular material or a high molecular material. When the intermediate layer 320 includes a low molecular material, the intermediate layer 320 may include an emission layer (EML), and may further include at least one of a hole injection layer (HIL), a hole transport layer (HTL), an electron transport layer (ETL), and an electron injection layer (EIL). The intermediate layer 320 may include various organic materials, for example, copper phthalocyanine (CuPc), N,N'-Di(naphthalene-1-yl)-N,N'-diphenyl-benzidine (NPB), tris-8-hydroxyquinoline aluminum ($Alq_3$), or the like. The layers may be formed by vapor deposition.

When the intermediate layer 320 includes a high molecular material, the intermediate layer 320 may include an HTL and an EML. The HTL may include PEDOT, and the EML may include poly-phenylenevinylene (PPV) based and polyfluorene-based high molecular materials. The intermediate layer 320 may be formed by screen printing, inkjet printing, laser induced thermal imaging (LITI), or the like.

However, the intermediate layer 320 is not limited to the above examples. The intermediate layer 320 may include a single layer across a plurality of pixel electrodes 310, or layers that are patterned with respect to each of the pixel electrodes 310.

The opposite electrode 330 is in an upper portion of the display area DA. As shown in FIG. 2, the opposite electrode 330 may be provided to cover the display area DA. That is, the opposite electrode 330 may be formed as a single element for a plurality of organic light-emitting devices and thus, correspond to the plurality of pixel electrodes 310.

Since such organic light-emitting device may be easily damaged by external moisture or oxygen, the encapsulation layer 400 may cover and protect the organic light-emitting device. The encapsulation layer 400 may cover a pixel area and extend to an outer area of the pixel area. As shown in FIG. 2C, the encapsulation layer 400 may include a first inorganic encapsulation layer 410, an organic encapsulation layer 420, and a second inorganic encapsulation layer 430.

The first inorganic encapsulation layer 410 may cover the opposite electrode 330, and include silicon oxide, silicon nitride, and/or silicon oxynitride. If necessary, other layers, such as a capping layer, may be provided between the first inorganic encapsulation layer 410 and the opposite electrode 330. Since the first inorganic encapsulation layer 410 is formed along its lower structure, an upper surface of the first inorganic encapsulation layer 410 is not flat, as shown in FIG. 2C. Unlike the first inorganic encapsulation layer 410, the organic encapsulation layer 420 covering the first inorganic encapsulation layer 410 may have a flat upper surface. In particular, an upper surface of the organic encapsulation layer 420 corresponding to the display area DA may be substantially flat. The organic encapsulation layer 420 may include at least one selected from the group consisting of PET, PEN, PC, PI, PES, polyoxymethylene (POM), polyarylate, and HMDSO. The second inorganic encapsulation layer 430 may cover the organic encapsulation layer 420, and include silicon oxide, silicon nitride, and/or silicon oxynitride. A periphery of the second inorganic encapsulation layer 430 outside the display area DA may contact the first inorganic encapsulation layer 410 so that the organic encapsulation layer 420 is not externally exposed.

Since the encapsulation layer 400 has a multi-layer structure including the first inorganic encapsulation layer 410, the organic encapsulation layer 420, and the second inorganic encapsulation layer 430, even when there is a fracture in the encapsulation layer 400, the fracture does not extend between the first inorganic encapsulation layer 410 and the organic encapsulation layer 420 or between the organic encapsulation layer 420 and the second inorganic encapsulation layer 430. Accordingly, external moisture or oxygen may be prevented from penetrating into the display area DA.

The touch screen layer 700 includes the touch electrode 710 is provided above the encapsulation layer 400. A cover layer 730 may be provided above the touch screen layer 700 and protect the touch screen layer 700.

The touch screen layer 700 may be, for example, a capacitance type. When the cover layer 730 is touched, whether a portion is touched may be determined by detecting a change in the mutual capacitance formed between touch electrodes 710 of the touch screen layer 700. Alternatively, the touch screen layer 700 may determine whether a portion is touched by detecting a change in the capacitance between the touch electrode 710 and the opposite electrode 330, or by other techniques.

The touch electrode 710 may be connected to the touch wire 720 that transmits signals detected by the touch electrode 710, the touch wire 720 may extend from the upper portion of the encapsulation layer 400 to the non-display area along a side of the encapsulation layer 400. The touch wire 720 may be connected to the touch screen layer 700, and extend from the upper portion of the encapsulation layer 400 until at least a portion of the touch wire 720 is in the bending area BA. In an exemplary embodiment, the touch wire 720 may be arranged across the bending area BA. The touch wire 720 may extend from the encapsulation layer 400 along a side of the encapsulation layer 400, and in this case, the side of the encapsulation layer 400 may be curved. The curve may be formed due to a stair-step formed by the planarization layer 140 and the pixel defining layer 150, as shown in FIG. 2C. As a result of the curve, the touch wire 720 may extend from the upper portion of the encapsulation layer 400 to a non-sealed area with a gradual slope.

Each of the touch electrode 710 and the touch wire 720 may be a single layer or layers including a conductive material, for example, Al, Cu, and/or Ti. The touch electrode 710 and the touch wire 720 may include an identical material.

The cover layer 730 may be flexible, and include, for example, polymethyl methacrylate, polydimethylsiloxane, PI, acrylate, PET, PEN, or the like. The cover layer 730 may be arranged above the touch screen layer 700 to protect the touch screen layer 700.

A touch buffer layer 610 may be provided between the encapsulation layer 400 and the touch screen layer 700. The touch buffer layer 610 may prevent damage to the encapsulation layer 400, and block interference signals that may be generated when the touch screen layer 700 is operated. The touch buffer layer 610 may include an inorganic material, such as silicon oxide, silicon nitride, silicon oxynitride, aluminum oxide, aluminum nitride, titanium oxide, titanium nitride, or the like, or an organic material such as PI, polyester, acryl, or the like. Also, the touch buffer layer 610 may be formed by stacking layers of the aforementioned materials.

The touch buffer layer 610 may be directly formed on the encapsulation layer 400 by deposition or using other methods. Since the touch screen layer 700 is also formed directly on the touch buffer layer 610, an additional attachment layer is unnecessary on the encapsulation layer 400. Therefore, a thickness of the display apparatus may be reduced.

The non-display area may include the bending area BA. The fan-out wiring 720a may be provided across the bending area BA in the non-display area. The fan-out wiring 720a may be electrically connected to the TFT 210 or the first signal wiring 213b, a second signal wiring 213c, and a third signal wiring 215c that apply electrical signals to the display device 300, which are provided in the display area DA. The fan-out wiring 720a being electrically connected to the first, second, and third signal wirings 213b, 213c, and 215c not only indicates that the fan-out wiring 720a is directly connected to the first signal wiring 213b through a contact hole as shown in FIG. 2C, but also indicates that the fan-out wiring 720a is indirectly connected to the second signal wiring 213c or the third signal wiring 215c via the first signal wiring 213b.

The first signal wiring 213b may be electrically connected to the second signal wiring 213c or the third signal wiring 215c in the display area DA. In an exemplary embodiment, the second signal wiring 213c or the third signal wiring 215c may be a gate line that applies signals to the gate electrode 213. In an exemplary embodiment, the second signal wiring 213c or the third signal wiring 215c may be a data line that applies signals to the source electrode 215a or the drain electrode 215b. In an exemplary embodiment, the first signal wiring 213b may be connected to the second signal wiring 213c through a via hole.

In an exemplary embodiment, the first signal wiring 213b and the second signal wiring 213c may include the same material as the gate electrode 213. The third signal wiring 215c may include the same material as the source electrode 215a and the drain electrode 215b.

The fan-out wiring 720a may include the same material as the touch wire 720. The fan-out wiring 720a and the touch wire 720 may be simultaneously formed under an identical manufacturing condition. In an exemplary embodiment, the fan-out wiring 720a and the touch wire 720 may include Al. In other exemplary embodiments, the fan-out wiring 720a and the touch wire 720 may include Ti/Al/Ti.

In an exemplary embodiment, the fan-out wiring 720a may include the same material as the touch wire 720, but a different material from the first signal wiring 213b, the second signal wiring 213c, the third signal wiring 215c, the source electrode 215a, or the drain electrode 215b.

In an exemplary embodiment, the fan-out wiring 720a may include the same material as the first signal wiring 213b, the second signal wiring 213c, the third signal wiring 215c, the source electrode 215a, or the drain electrode 215b.

The fan-out wiring 720a and the touch wire 720 may be formed by a low-temperature layer formation process at about 90° C. or below. This may be to protect the display device 300 or other elements that are already formed. On the other hand, the first signal wiring 213b, the second signal wiring 213c, the third signal wiring 215c, the source electrode 215a, and the drain electrode 215b may be formed by a high-temperature layer formation process at a temperature that is equal to or higher than 90° C., for example, about 150° C., in which the first signal wiring 213b, the second signal wiring 213c, the third signal wiring 215c, the source electrode 215a, and the drain electrode 215b are formed before the display device 300, the encapsulation layer 400, or another element is formed.

Accordingly, even when the fan-out wiring 720a is formed by using the same material as the first signal wiring 213b, the second signal wiring 213c, the third signal wiring 215c, the source electrode 215a, or the drain electrode 215b, respective resistivity values and respective grain sizes may vary. For example, when an identical material is used, a resistance value of the fan-out wiring 720a may be about 25% greater than a resistance value of the first, second, and third signal wirings 213b, 213c, and 215c. Also, a grain size of the fan-out wiring 720a may be smaller than a grain size of the first, second, and third signal wirings 213b, 213c, and 215c.

In an embodiment, respective thicknesses of the fan-out wiring 720a and the first, second, and third signal wirings 213b, 213c, and 215c may be different from one another. For example, a thickness of the fan-out wiring 720a may be less than a thickness of the third signal wiring 215c that is formed by using the same material as the source electrode 215a and the drain electrode 215b. In an exemplary embodiment, the thickness of the fan-out wiring 720a may be about 50% of the thickness of the third signal wiring 215c.

An organic material layer 160 may be provided in at least a portion of the bending area BA between the fan-out wiring 720a and the substrate 100. The organic material layer 160 may prevent fractures in the fan-out wiring 720a of the bending area BA when the display apparatus is bent. The organic material layer 160 may absorb tensile stress of the substrate 100 and other elements, caused by bending, to thus effectively reduce tensile stress concentrated on the fan-out wiring 720a.

The organic material layer 160 may be formed by using the same material and at the same time as the planarization layer 140, the pixel defining layer 150, the organic encapsulation layer 420 of the encapsulation layer 400, or the touch buffer layer 610. That is, the organic material layer 160 may be formed during a mask process for forming the planarization layer 140, the pixel defining layer 150, the organic encapsulation layer 420 of the encapsulation layer 400, or the touch buffer layer 610. Accordingly, an additional mask process for forming the organic material layer 160 may be omitted. The buffer layer 110, the gate insulating layer 120, or the interlayer insulating layer 130 may also include an organic material. In this case, the organic material layer 160 may be formed by using the same material and at the same time as the buffer layer 110, the gate insulating layer 120, or the interlayer insulating layer 130.

If the fan-out wiring 720a is formed at the same time as the first signal wiring 213b, the second signal wiring 213c, the third signal wiring 215c, the source electrode 215a, or the drain electrode 215b, an additional mask has to be used to form the organic material layer 160. According to an exemplary embodiment, since the fan-out wiring 720a and the touch wire 720 are simultaneously formed, the organic material layer 160 may be formed together with a layer including an organic material provided in the display area DA, which thus simplifies the mask process.

The buffer layer 110, the gate insulating layer 120, and the interlayer insulating layer 130, all of which include an inorganic material, may be referred to as an inorganic insulating layer. The inorganic insulating layer may have an opening corresponding to the bending area BA as shown in FIG. 2C. That is, the buffer layer 110, the gate insulating layer 120, and the interlayer insulating layer 130 may respectively have openings 110a, 120a, and 130a that correspond to the bending area BA. An opening corresponding to the bending area BA may indicate that the opening overlaps the bending area BA. The opening may be larger than the bending area BA. Accordingly, FIG. 2C shows that a width OW of the opening is greater than a width of the bending area BA. The smallest from among the respective openings 110a, 120a, and 130a of the buffer layer 110, the gate insulating layer 120, and the interlayer insulating layer 130 may be determined as a size of the opening. In FIG. 2C, the size of the opening 110a of the buffer layer 110 is determined as the size of the opening.

The display apparatus according to the present exemplary embodiment includes the organic material layer 160 that fills at least a portion of the opening of the inorganic insulating layer. FIG. 2C shows that the organic material layer 160 totally fills the opening. The fan-out wiring 720a may extend across the bending area BA from the first area 1A to the second area 2A, and may be on the organic material layer 160. In areas where the organic material layer 160 is not provided, the fan-out wiring 720a may be on the inorganic insulating layer, such as the interlayer insulating layer 130.

Since the inorganic insulating layer has a higher hardness than the organic material layer 160, the inorganic insulating layer in the bending area BA is likely to have fractures. When the inorganic insulating layer fractures, there is a high probability that the fractures may occur in the fan-out wiring 720a. Although the organic material layer 160 may block the fractures from spreading, the opening formed in the inorganic insulating layer may further reduce the probability of the occurrence of fractures in the inorganic insulating layer. Therefore, a reduced level of tensile stress may concentrate on the fan-out wiring 720a.

As shown in FIG. 2C, the organic material layer 160 may cover an inner surface of the opening of the inorganic insulating layer. Various wires of the display apparatus may be formed by forming a conductive material layer on an entire surface of the substrate 100 and patterning the conductive material layer. If the organic material layer 160 does not cover an inner surface of the opening 110a of the buffer layer 110, an inner surface of the opening 120a of the gate insulating layer 120, or an inner surface of the opening 130a of the interlayer insulating layer 130, during the patterning of the conductive material layer, a conductive material may not be removed from but may instead remain in the inner surface of the opening 110a of the buffer layer 110, the inner surface of the opening 120a of the gate insulating layer 120, or the inner surface of the opening 130a of the interlayer insulating layer 130. In this case, the remaining conductive material may cause a short circuit between conductive layers. Therefore, the organic material layer 160 may be formed to cover the inner surface of the opening of the inorganic insulating layer. Although FIG. 2C shows that the organic material layer 160 has a uniform thickness for reference, alternatively, the organic material layer 160 may have different thicknesses according to various locations so that the organic material layer 160 gradually rises and falls around the inner surface of the opening 110a of the buffer layer 110, the inner surface of the opening 120a of the gate insulating layer 120, or the inner surface of the opening 130a of the interlayer insulating layer 130.

The display apparatus according to the present exemplary embodiment may further include a protection film 170. The protection film 170 may be a lower protection film protecting a lower surface of the substrate 100 and, as shown in FIG. 2C, may have an opening 1700P. The opening 1700P may correspond to the bending area BA. An area of the opening 1700P may be greater than that of the bending area BA. In FIG. 2C, a width of the opening 1700P may be greater than that of the bending area BA.

The protection film 170 may protect the lower surface of the substrate 100 and thus, having rigidity itself. Accordingly, when the protection film 170 has a low flexibility, since the substrate 100 is bent, the protection film 170 may be separated from the substrate 100. Thus, as shown in FIG. 2C, the protection film 170 may have the opening 1700P corresponding to the bending area BA, thereby effectively preventing the protection film 170 from being separated from the substrate 100. To this end, as described above, the area of the opening 1700P of the protection film 170 may be greater than that of the bending area BA. In FIG. 2C, the protection film 170 is removed from the bending area BA but is not limited thereto. The protection film 170 may be variously modified, for example, the protection film 170 may not be completely removed from the bending area BA but may have a small thickness in the bending area BA compared to the first area 1A or the second area 2A.

A bending protection layer BPL 600 may be located outside the display area DA. That is, the BPL 600 may correspond to at least the bending area BA to be located above the fan-out wiring 720a.

When a stack structure is bent, a stress neutral plane may be present in the stack structure. If the BPL 600 is not present, an excessive tensile stress may be applied to the fan-out wiring 720a in the bending area BA according to bending of the substrate 100 because a location of the fan-out wiring 720a may not correspond to the stress neutral plane. However, by allowing the BPL 600 to be present and adjusting a thickness and a modulus of the BPL 600, a location of the stress neutral plane in a stack structure including all the substrate 100, the fan-out wiring 720a, and the BPL 600 may be adjusted. Thus, the stress neutral plane may be located near the fan-out wiring 720a through the BPL 600, and thus less tensile stress may be applied to the fan-out wiring 720a.

In FIG. 2C, a top surface in a direction (−x direction) toward the display area DA of the BPL 600 coincides with a top surface in a direction (+z direction) of the cover layer 730, but the present invention is not limited thereto. For example, an end of the BPL 600 in the direction (the −x direction) toward the display area DA may partially cover a top surface at an edge of the cover layer 730. Otherwise, various modification may be possible, for example, the end of the BPL 600 in the direction (the −x direction) toward the display area DA may not contact the cover layer 730. The BPL 600 may extend to an upper portion of the display area DA to cover the touch electrode 710.

The BPL 600 may be formed by applying and hardening a liquid phase material or a paste-type material. In this case, a volume of the BPL 600 may be reduced during a hardening process. In this regard, when a portion of the BPL 600 in the direction (-x direction) toward the display area DA is in contact with the cover layer 730, a location of the portion of the BPL 600 is fixed, and thus, volume reduction occurs in a remaining portion of the BPL 600. As a result, a thickness of the portion of the BPL 600 in the direction (-x direction) toward the display area DA may be greater than those of other portions of the BPL 600.

The BPL 600 may expose the signal terminal 21 (see FIG. 2B) of the second area 2A. In this regard, in the second area 2A, the signal terminal 21 may be used to connect a control unit such as various electronic elements or a PCB, etc.

Figure 3A:
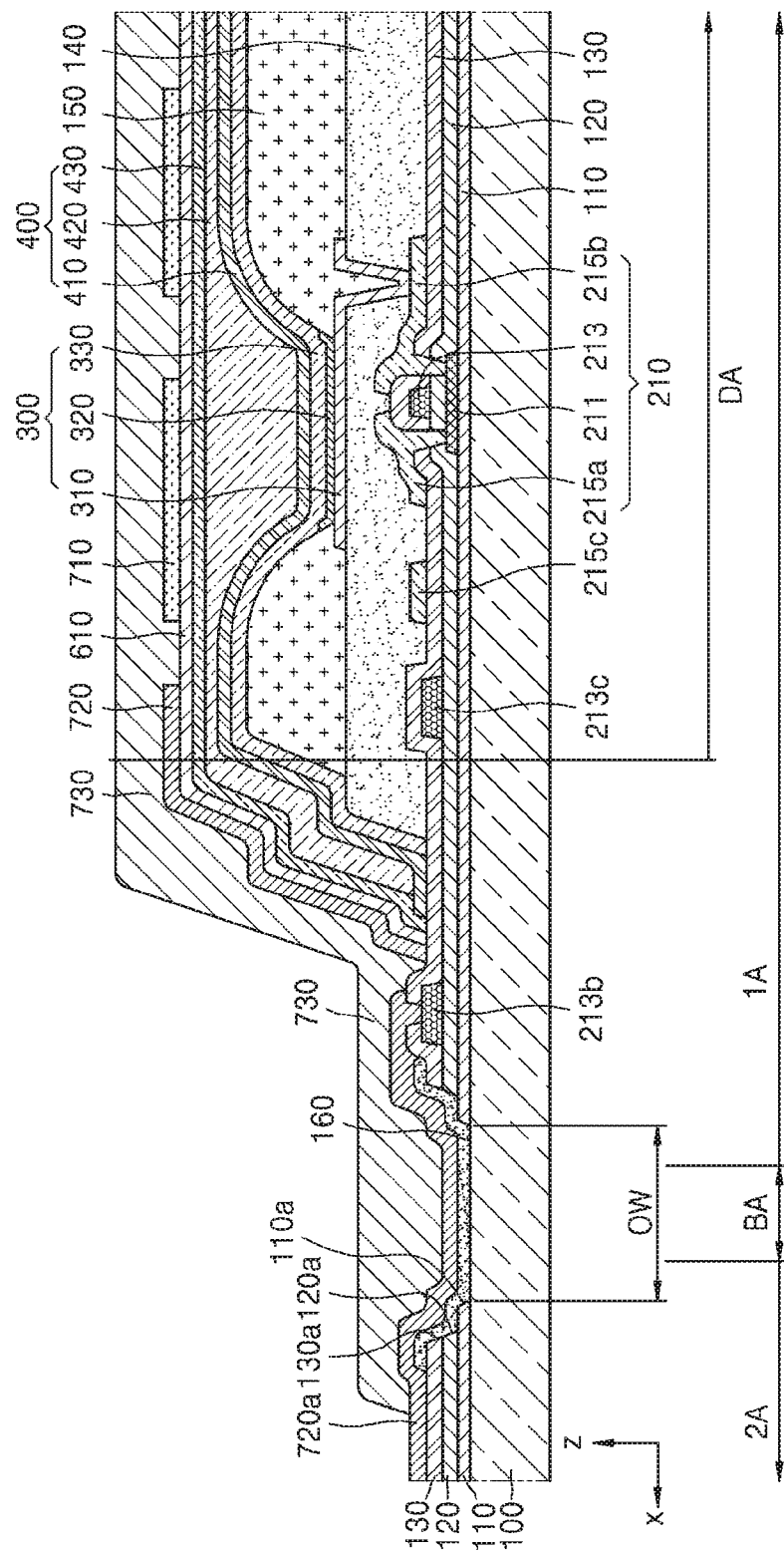
FIG. 3A is a cross-sectional view schematically illustrating a portion of a display apparatus according to an exemplary embodiment.

FIG. 3A is a cross-sectional view schematically illustrating a portion of a display apparatus according to another exemplary embodiment. Referring to FIG. 3A, the cover layer 730 may extend to a non-display area from an upper portion of the touch screen layer 700 to cover the fan-out wiring 720a. Accordingly, the cover layer 730 may simultaneously protect the touch screen layer 700 and the fan-out wiring 720a. As shown in FIG. 3A, the cover layer 730 may extend as one piece from the display area DA to at least the bending area BA. In this case, the cover layer 730 may function as the BPL 600 (see FIG. 2C). That is, the cover layer 730 may adjust a location of a stress neutral plane in the bending area BA. The stress neutral plane may be located near the fan-out wiring 720a through the cover layer 730, and thus, a reduced level of tensile stress may be applied to the fan-out wiring 720a.

Figure 3B:
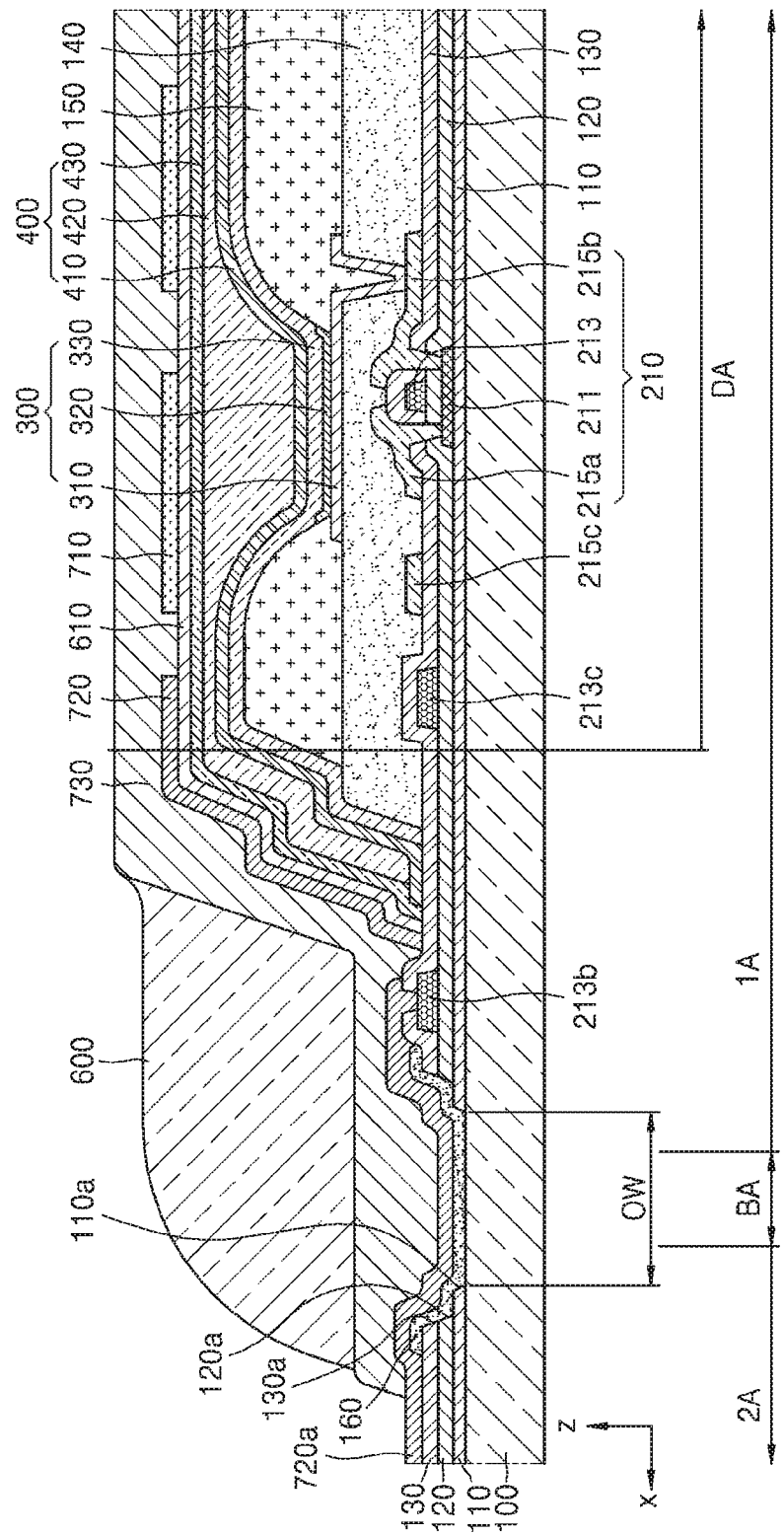
FIG. 3B is a cross-sectional view schematically illustrating a portion of a display apparatus according to an exemplary embodiment.

FIG. 3B is a cross-sectional view schematically illustrating a portion of a display apparatus according to another exemplary embodiment. Referring to FIG. 3B, the cover layer 730 may extend to a non-display area from an upper portion of the touch screen layer 700 to cover the fan-out wiring 720a. That is, the cover layer 730 may extend as one piece from the display area DA to at least the bending area BA. The BPL 600 may be further provided over the cover layer 730 in the non-display area. The BPL 600, as described above, may be used to apply a reduced level of tensile stress to the fan-out wiring 720a by locating a stress neutral plane near the fan-out wiring 720a.

In the figures of the exemplary embodiments to be described below, the cover layer 730 extends to the bending area BA, but the present invention is not limited thereto. As described above, various modifications may be possible, for example, the BPL 600 may be arranged in the bending area BA, instead of the cover layer 730, the cover layer 730 and the BPL 600 may be simultaneously arranged or neither of them may be arranged.

Figure 4A:
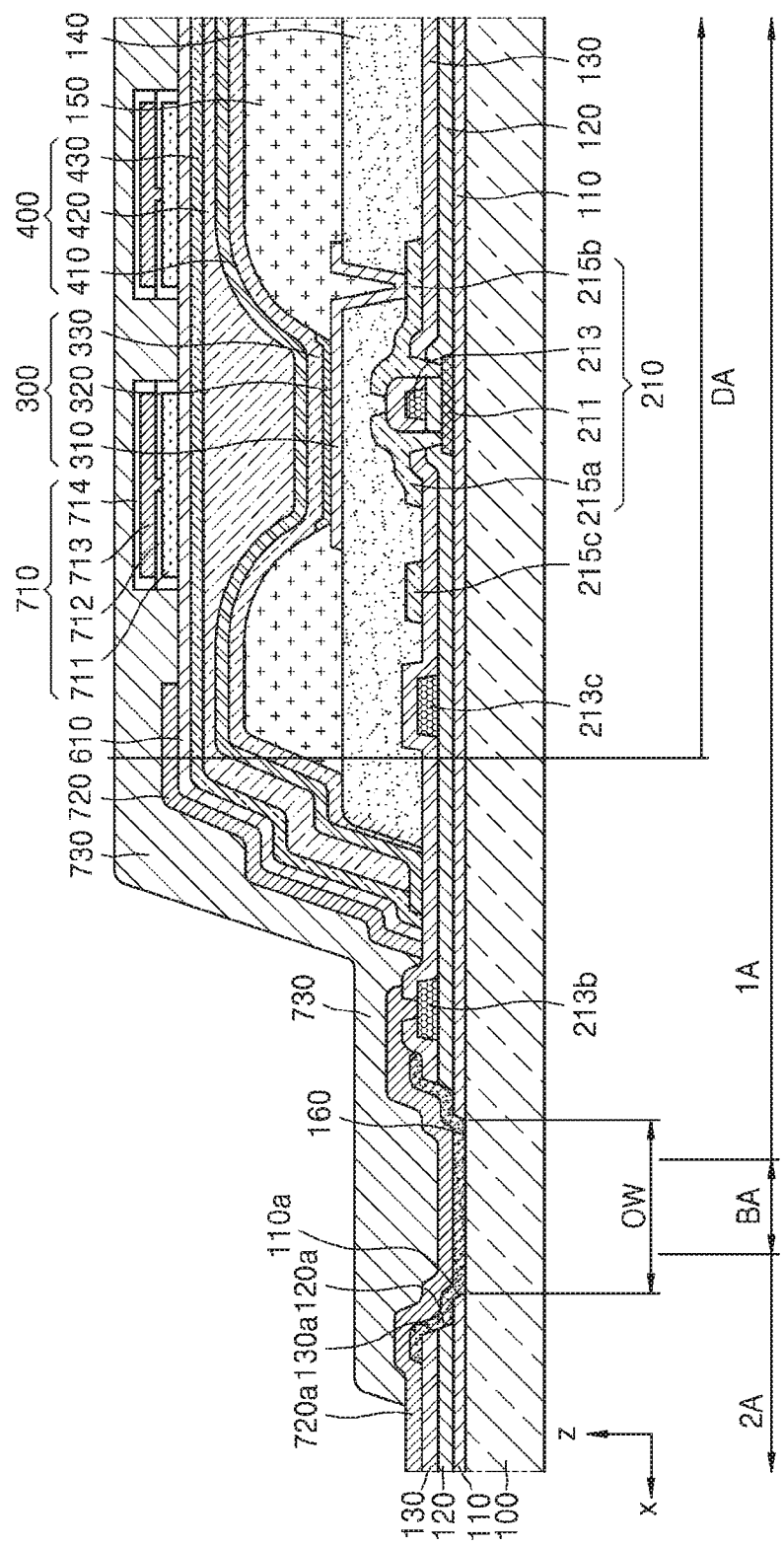
FIG. 4A is a cross-sectional view schematically illustrating a portion of a display apparatus according to an exemplary embodiment.

FIG. 4A is a cross-sectional view schematically illustrating a portion of a display apparatus according to another exemplary embodiment. Referring to FIG. 4A, the touch electrode 710 may be formed by sequentially stacking a first touch conductive layer 711, a first insulating layer 712, a second touch conductive layer 713, and a second insulating layer 714. The first touch conductive layer 711 may be electrically connected to the second touch conductive layer 713. In some embodiments, the first insulating layer 712 may include a via hole that exposes an upper surface of the first touch conductive layer 711, and the first touch conductive layer 711 may be connected to the second touch conductive layer 713 through the via hole.

By using the first touch conductive layer 711 and the second touch conductive layer 713, resistance of the touch electrode 710 may decrease, and thus the response speed of the touch screen layer 700 may increase.

In an exemplary embodiment, the fan-out wiring 720a and the touch wire 720 may include the same material as the first touch conductive layer 711 or the second touch conductive layer 713. In other exemplary embodiments, the fan-out wiring 720a and the touch wire 720 may have a structure in which a first layer including the same material as the first touch conductive layer 711, and a second layer including the same material as the second touch conductive layer 713, are stacked.

In an exemplary embodiment, the touch wire 720 may include the same material as the first touch conductive layer 711 or the second touch conductive layer 713. In other exemplary embodiments, the touch wire 720 may be formed by stacking a first layer including the same material as the first touch conductive layer 711 and a second layer including layer including the same material as the second touch conductive layer 713.

Each of the first touch conductive layer 711 and the second touch conductive layer 713 may be a single layer or layers formed of a conductive material, for example, Al, Cu, and/or Ti. In an exemplary embodiment, each of the first touch conductive layer 711 and the second touch conductive layer 713 may have a stack structure formed of Ti/Al/Ti.

The first insulating layer 712 may include an inorganic material or an organic material. The inorganic material may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one selected from an acryl-based resin, a methacryl-based resin, polyisoprene, a vinyl-based resin, an epoxy-based resin, a urethane-based resin, a cellulose-based resin, and a perylene-based resin.

The second insulating layer 714 may include an organic material, for example, at least one selected from an acryl-based resin, a methacryl-based resin, polyisoprene, a vinyl-based resin, an epoxy-based resin, a urethane-based resin, a cellulose-based resin, and a perylene-based resin.

In this case, the organic material layer 160 may be simultaneously formed with the first insulating layer 712 or the second insulating layer 714 by using the same material as the first insulating layer 712 or the second insulating layer 714.

The organic material layer 160 may be simultaneously formed with the planarization layer 140, the pixel defining layer 150, the organic encapsulation layer 420 of the encapsulation layer 400, the touch buffer layer 610, the first insulating layer 712 or the second insulating layer 714 by using the same material as the planarization layer 140, the pixel defining layer 150, the organic encapsulation layer 420 of the encapsulation layer 400, the touch buffer layer 610, the first insulating layer 712 or the second insulating layer 714 but the present invention is not limited thereto. For example, the organic material layer 160 may be formed through a process different from a process forming the planarization layer 140, the pixel defining layer 150, the organic encapsulation layer 420 of the encapsulation layer 400, the touch buffer layer 610, the first insulating layer 712 or the second insulating layer 714.

The buffer layer 110, the gate insulating layer 120 and/or the interlayer insulating layer 130 may include an organic material. In this case, the organic material layer 160 may be formed by using the same material as the buffer layer 110, the gate insulating layer 120, or the interlayer insulating layer 130.

Figure 4B:
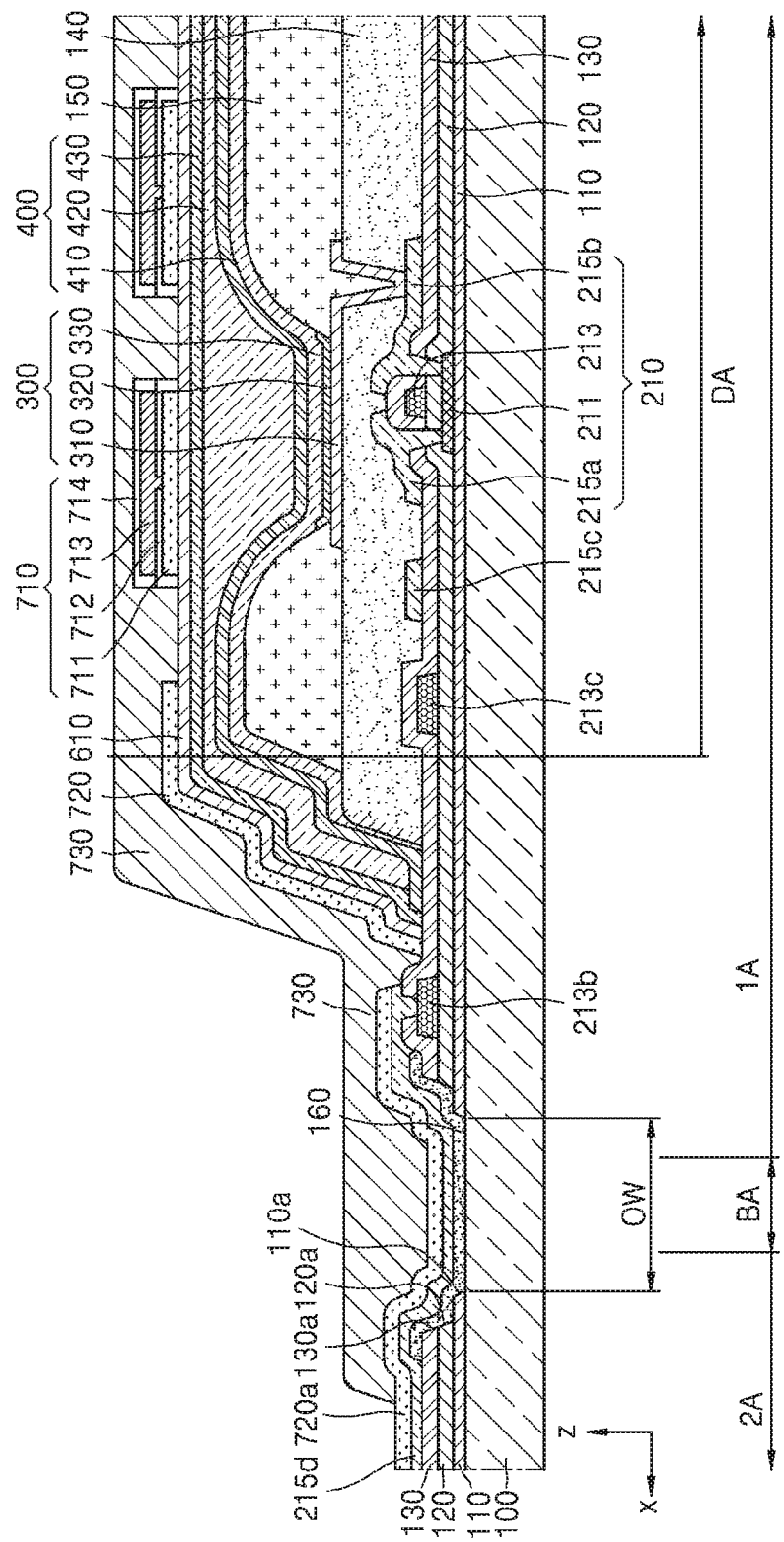
FIG. 4B is a cross-sectional view schematically illustrating a portion of a display apparatus according to an exemplary embodiment.
Figure 4C:
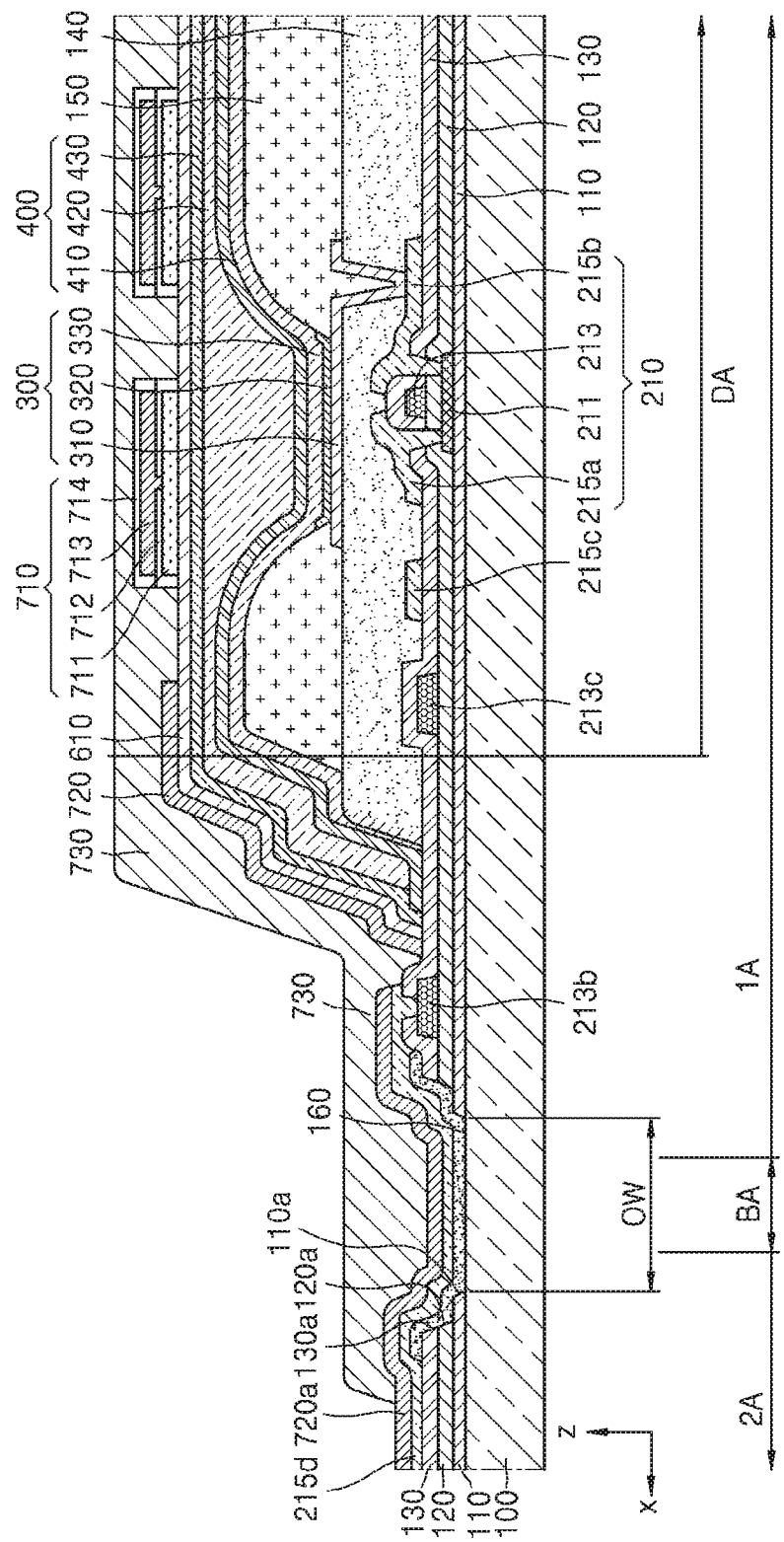
FIG. 4C is a cross-sectional view schematically illustrating a portion of a display apparatus according to an exemplary embodiment.

FIGS. 4B and 4C are cross-sectional views schematically illustrating a portion of a display apparatus according to another exemplary embodiment. The display apparatus according to the present exemplary embodiment is different from a display apparatus according to the above-described exemplary embodiment in that the additional conductive layer 215d may be further provided in a lower portion of the fan-out wiring 720a. As described above, if the fan-out wiring 720a is simultaneously formed with the additional conductive layer 215d by using the same material as the additional conductive layer 215d, the additional conductive layer 215d may be simultaneously formed with the source electrode layer 215a or the drain electrode 215b by using the same material as the source electrode layer 215a or the drain electrode 215b. The additional conductive layer 215d may be located in a lower portion of the fan-out wiring 720a at least in the bending area BA such that the additional conductive layer 215d is electrically connected to the fan-out wiring 720a.

As described above, since the display apparatus according to the present exemplary embodiment includes the fan-out wiring 720a and the additional conductive layer 215d in the bending area BA, a conductive layer of the bending area BA may have a multiple layer structure. Thus, even if a defect occurs in the bending area BA as a result of a fracture formed in the fan-out wiring 720a, an electric signal may be transferred to the display area DA by the additional conducive layer 215d without a problem. Alternatively, even if a defect occurs as a result of a fracture formed in the additional conducive layer 215d, an electric signal may be transferred to the display area DA by the fan-out wiring 720a without a problem.

In the present exemplary embodiment, the fan-out wiring 720a and the touch wire 720 may include the same material as the first touch conductive layer 711 as shown in FIG. 4B or may include the same material as the second touch conducive layer 713 as shown in FIG. 4C.

Figure 4D:
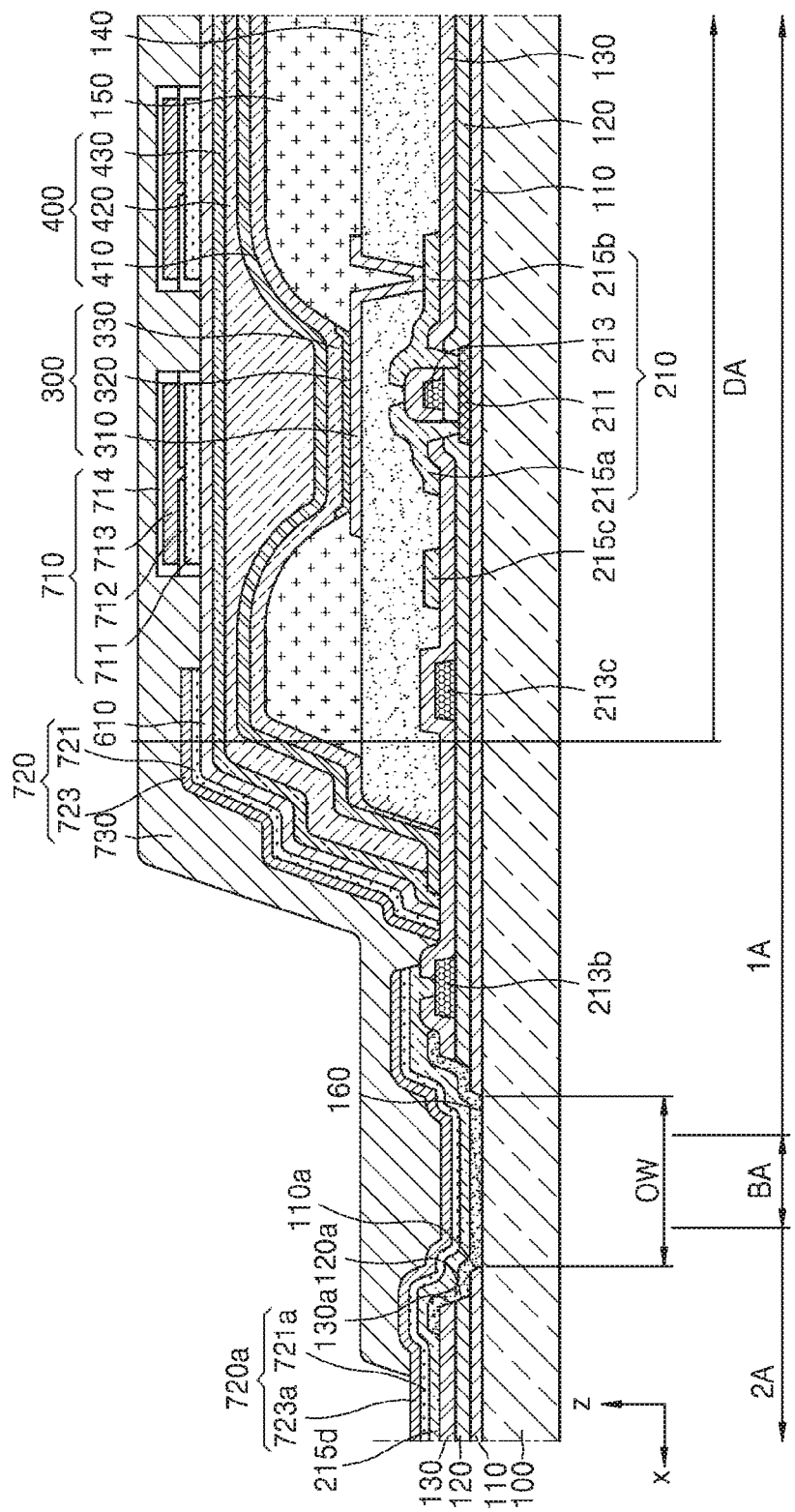
FIG. 4D is a cross-sectional view schematically illustrating a portion of a display apparatus according to an exemplary embodiment.

FIG. 4D is a cross-sectional view schematically illustrating a portion of a display apparatus according to another exemplary embodiment. The display apparatus according to the present exemplary embodiment is different from a display apparatus described with reference to FIG. 4B in that the fan-out wiring 720a has a structure in which a first layer 721a including the same material as the first touch conductive layer 711, and a second layer 723a including the same material as the second touch conductive layer 713, are stacked.

In the present exemplary embodiment, the touch wire 720 may have a structure in which a first wire layer 721 including the same material as the first touch conductive layer 711, and a second wire layer 723 including the same material as the second touch conductive layer 713, are stacked.

As described above, since the display apparatus according to the present exemplary embodiment includes a conductive layer having a multiple layer structure in the bending area BA, even if a crack occurs in a conductive layer having a single layer structure, an electrical signal may be transferred to the display area DA without a problem.

Figure 4E:
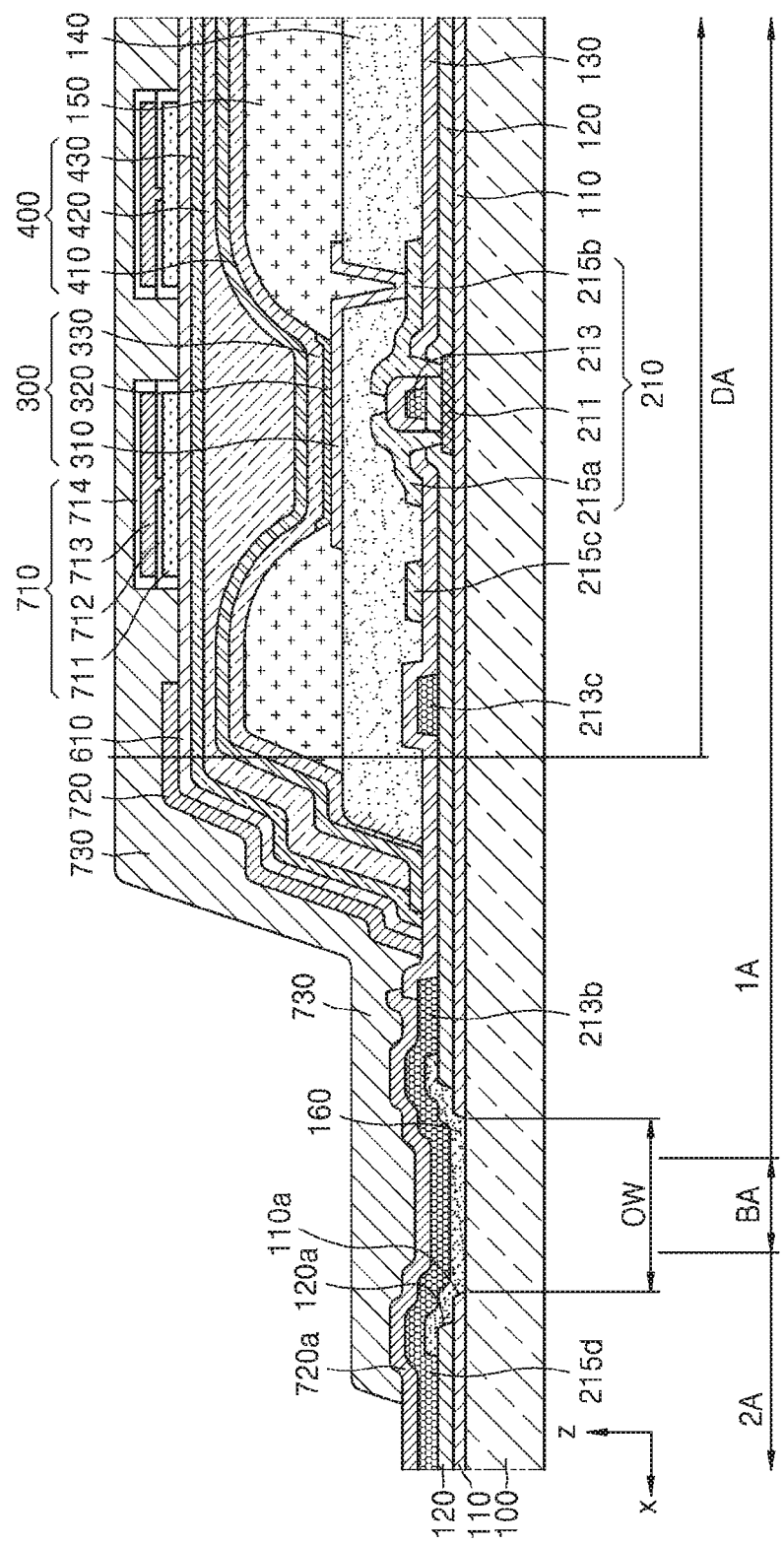
FIG. 4E is a cross-sectional view schematically illustrating a portion of a display apparatus according to an exemplary embodiment.

FIG. 4E is a cross-sectional view schematically illustrating a portion of a display apparatus according to another exemplary embodiment. Referring to FIG. 4E, the additional conductive layer 215d may be arranged in a lower portion of the fan-out wiring 720a. The additional conductive layer 215d may be formed by the first signal wiring 213b extending across the bending area BA. That is, the additional conductive layer 215d may include the same material as the gate electrode 213. In the present exemplary embodiment, the additional conductive layer 215d may directly contact the fan-out wiring 720a in the bending area BA to form a multiple layer structure.

As described above, since the display apparatus according to the present exemplary embodiment includes the fan-out wiring 720a and the additional conductive layer 215d in the bending area BA, a conductive layer of the bending area BA may have a multiple layer structure. Thus, even if a defect occurs in the bending area BA as a result of a fracture formed in the fan-out wiring 720a, an electric signal may be transferred to the display area DA by the additional conducive layer 215d without a problem. Alternatively, even if a defect occurs as a result of a fracture formed in the additional conducive layer 215d, an electric signal may be transferred to the display area DA by the fan-out wiring 720a without a problem.

As described above, the fan-out wiring 720a may include the same material as the first touch conductive layer 711 or the second touch conducive layer 713. The fan-out wiring 720a may have a structure in which a first layer including the same material as the first touch conductive layer 711 and a second layer including the same material as the second touch conductive layer 713 are stacked.

Figure 4F:
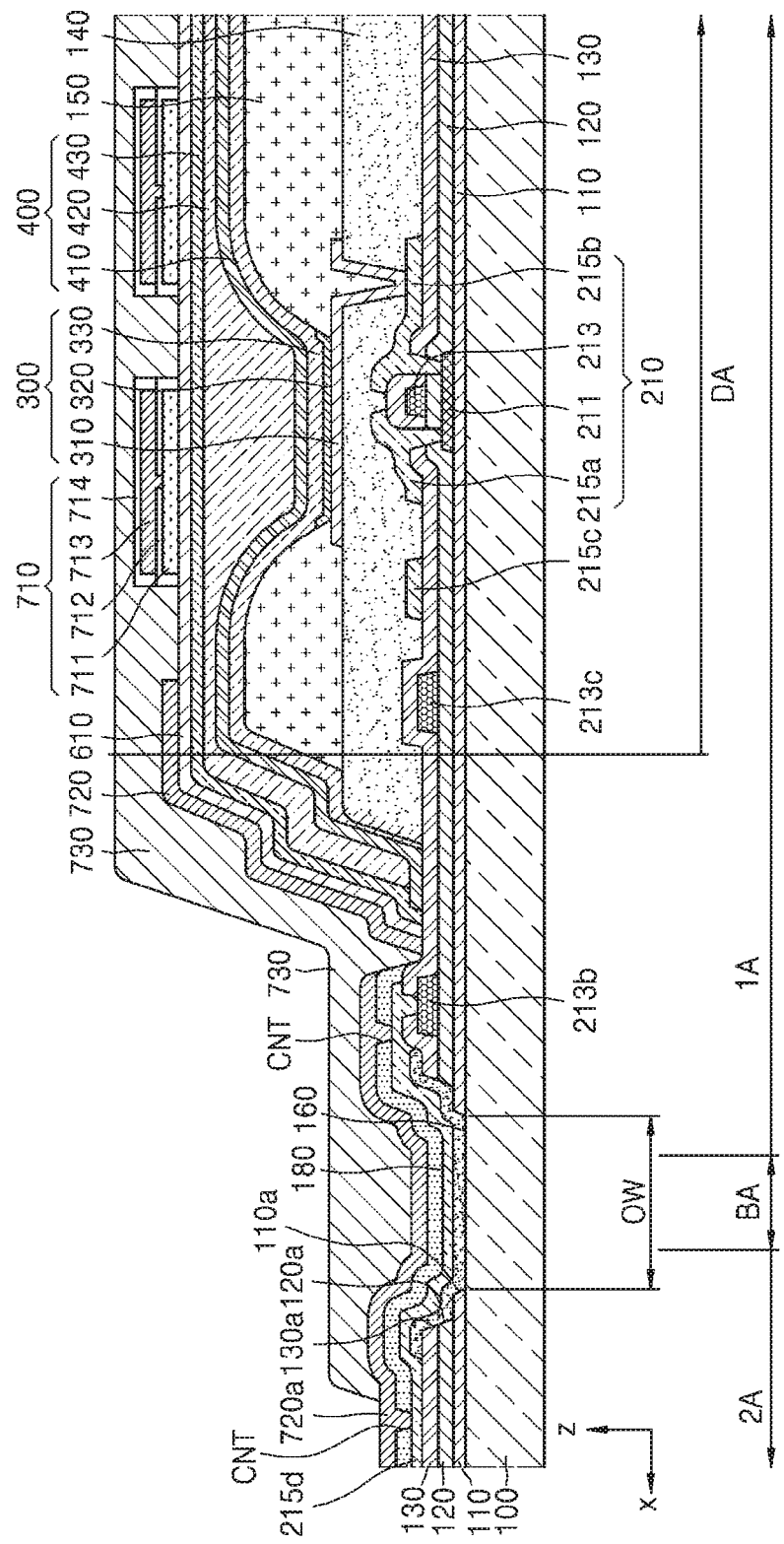
FIG. 4F is a cross-sectional view schematically illustrating a portion of a display apparatus according to an exemplary embodiment.

FIGS. 4F and 4G are cross-sectional views schematically illustrating a portion of a display apparatus according to another exemplary embodiment.

Referring to FIG. 4F, the display apparatus according to the present exemplary embodiment may include the additional conductive layer 215d in a lower portion of the fan-out wiring 720a in the bending area BA and an insulating layer 180 between the fan-out wiring 720a and the additional conductive layer 215d.

As described above, the fan-out wiring 720a may be simultaneously formed with the touch wire 720 by using the same material as the touch wire 720, and the additional conductive layer 215d may be simultaneously formed with the source electrode 215a, the drain electrode 215b, or the gate electrode 213 by using the same material as the source electrode 215a, the drain electrode 215b, or the gate electrode 213. The additional conductive layer 215d may be electrically connected to the fan-out wiring 720a through a via hole provided in the insulating layer 180. The via hole may be arranged in the first area 1A and/or the second area 2A.

The additional conductive layer 215d and the fan-out wiring 720a may have various modifications, for example, the additional conductive layer 215d and the fan-out wiring 720a may be arranged over the bending area BA or may overlap only in a part of the bending area BA as described in the above-described exemplary embodiments.

The insulating layer 180 may include an organic material or an inorganic material. The insulating layer 180 may be simultaneously formed with the planarization layer 140, the pixel defining layer 150, the inorganic encapsulation layers 410 and 430 of the encapsulation layer 400, the organic encapsulation layer 420, the touch buffer layer 610, etc. by using the same material as the planarization layer 140, the pixel defining layer 150, the inorganic encapsulation layers 410 and 430 of the encapsulation layer 400, the organic encapsulation layer 420, the touch buffer layer 610, etc.

Referring to FIG. 4G, the additional conductive layer 215d may be present only in a part of the bending area BA. For example, the additional conductive layer 215d may be present in both edges of the bending area BA to contact the fan-out wiring 720a. The additional conductive layer 215d may have various modifications, for example, the additional conductive layer 215*d* may be present in only one edge of the bending area BA.

Figure 4H:
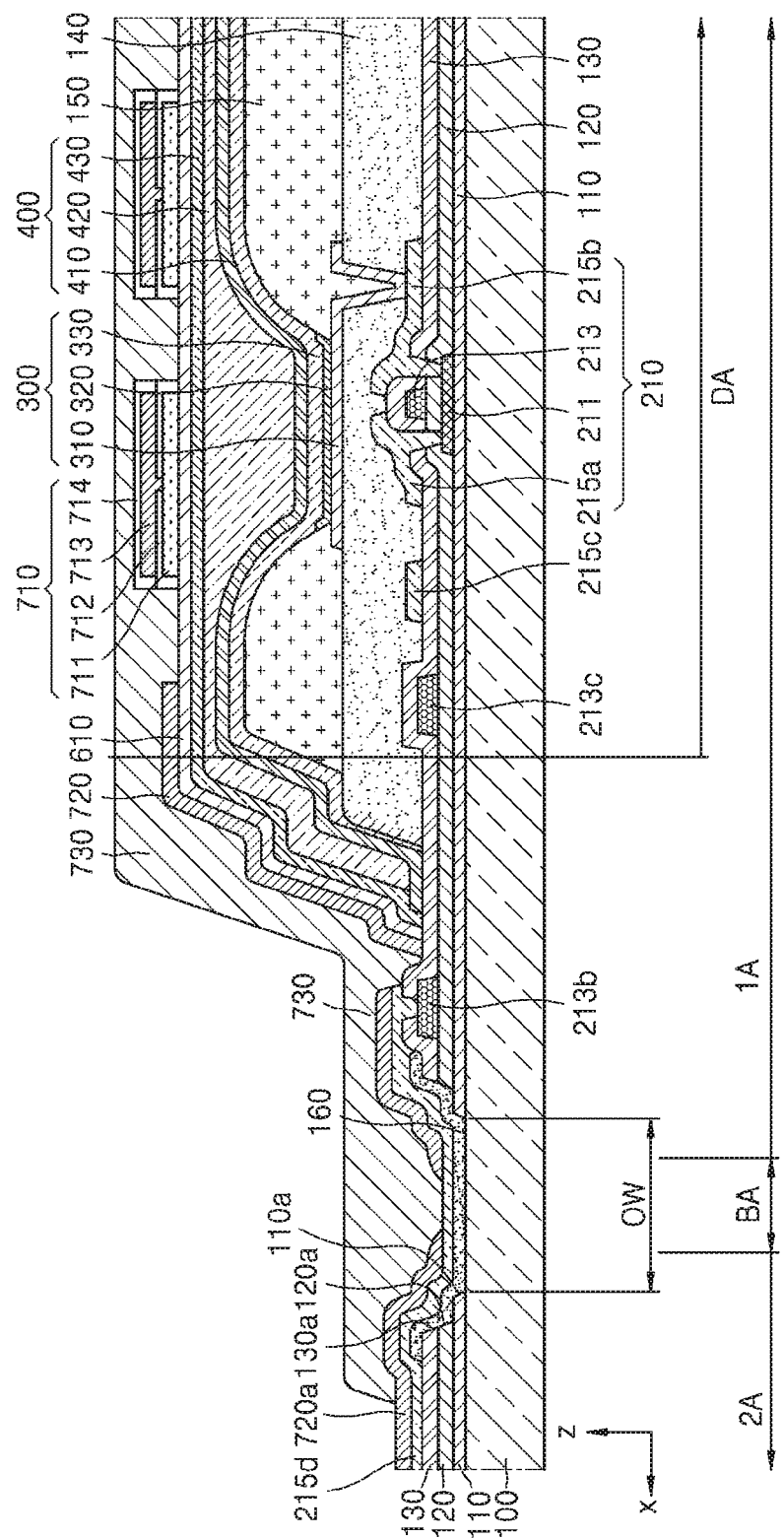
FIG. 4H is a cross-sectional view schematically illustrating a portion of a display apparatus according to an exemplary embodiment.

FIG. 4H is a cross-sectional view schematically illustrating a portion of a display apparatus according to another exemplary embodiment. Referring to FIG. 4H, the fan-out wiring 720*a* may be present only in a part of the bending area BA. For example, the fan-out wiring 720*a* may be present in both edges of the bending area BA to contact the additional conductive layer 215*d*. The fan-out wiring 720*a* may have various modifications, for example, the fan-out wiring 720*a* may be present in only one edge of the bending area BA.

Figure 4I:
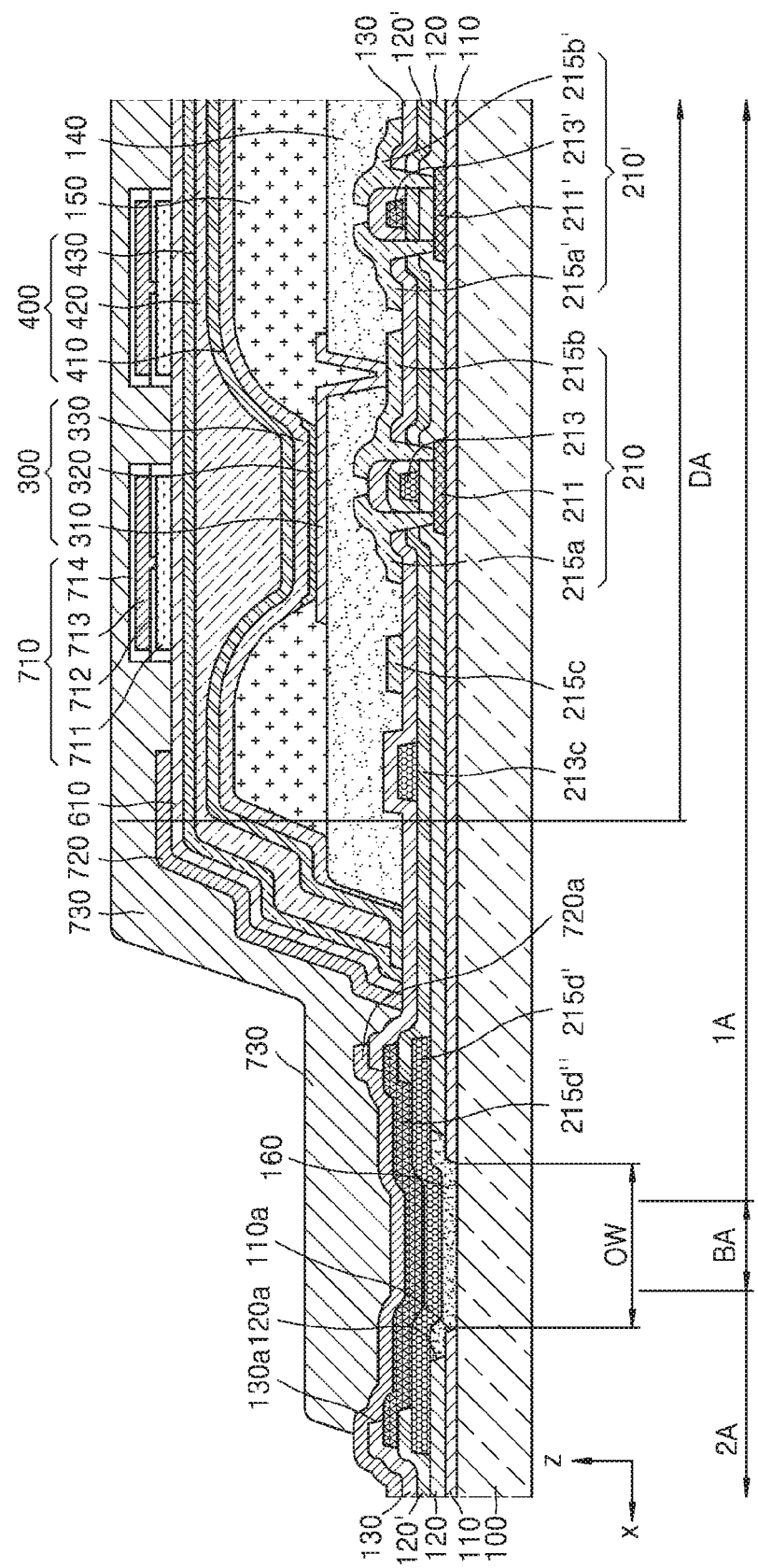
FIG. 4I is a cross-sectional view schematically illustrating a portion of a display apparatus according to an exemplary embodiment.

FIG. 4I is a cross-sectional view schematically illustrating a portion of a display apparatus according to another exemplary embodiment.

The display apparatus according to the present exemplary embodiment may include a second TFT 210' in the display area DA, in addition to the TFT 210. The TFT 210' may include a semiconductor layer 211', a source electrode 215*a*', a drain electrode 215*b*', and a gate electrode 213'. In this regard, the semiconductor layer 211' may include the same material as the semiconductor layer 211, and may be located on the same layer as the semiconductor layer 211. The source electrode 215*a*' and the drain electrode 215*b*' may also include the same materials as the source electrode 215*a* and the drain electrode 215*b* and may be located in the same layer as the source electrode 215*a* and the drain electrode 215*b*. However, the gate electrode 213' may be located in a different layer from the gate electrode 213, which may indicate that the gate electrode 213' and the gate electrode 213 are not simultaneously formed and are formed in different operations.

In more detail, a gate insulating layer 120' may be located above the gate insulating layer 120, and the source electrode 215*a*, the drain electrode 215*b*, the source electrode 215*a*', and the drain electrode 215*b*' may be located above the interlayer insulating layer 130 covering the gate insulating layer 120'. The gate electrode 213 may be located above the gate insulating layer 120. The gate insulating layer 120' may cover the gate electrode 213. The gate electrode 213' may be located above the gate insulating layer 120'.

In some exemplary embodiments, a wire arranged in the same layer as the gate electrode 213' and/or an electrode of a capacitor (not shown) arranged in the same layer as the gate electrode 213' may be added. In this case, various modifications may be possible, for example, the TFT 210' may be omitted.

In the present exemplary embodiment, the display apparatus may further include a first additional conductive layer 215*d*' and/or a second additional conductive layer 215*d*" in the bending area BA. The first additional conductive layer 215*d*' may include the same material as the gate electrode 213 and may be arranged in the same layer as the gate electrode 213. The second additional conductive layer 215*d*" may include the same material as the gate electrode 213' and may be arranged in the same layer as the gate electrode 213'.

The first additional conductive layer 215*d*' and/or the second additional conductive layer 215*d*" may extend over the bending area BA and may be arranged in a lower portion of the fan-out wiring 720*a* in the bending area BA. In FIG. 4I, the first additional conductive layer 215*d*', the second additional conductive layer 215*d*", and the fan-out wiring 720*a* may be sequentially stacked in the bending area BA to form a multiple layer structure. Thus, even if a defect occurs in the bending area BA as a result of a fracture formed in the fan-out wiring 720*a*, an electric signal may be transferred to the display area DA by the first additional conductive layer 215*d*' and/or the second additional conductive layer 215*d*" without a problem. Alternatively, even if a defect occurs as a result of a fracture formed in the first additional conductive layer 215*d*' and/or the second additional conductive layer 215*d*", an electric signal may be transferred to the display area DA by the fan-out wiring 720*a* without a problem.

However, the present invention is not limited thereto. For example, the first additional conductive layer 215*d*', the second additional conductive layer 215*d*", and/or the fan-out wiring 720*a* may be arranged over the bending area BA or may overlap only in a part of the bending area BA as described in the above-described embodiments.

In an exemplary embodiment, the first additional conductive layer 215*d*' and the fan-out wiring 720*a* may overlap in a part of the bending area BA, and the second additional conductive layer 215*d*" and the fan-out wiring 720*a* may overlap in another part of the bending area BA. Alternatively, various modifications may be possible, for example, the first additional conductive layer 215*d*' and/or the second additional conductive layer 215*d*" may not overlap with the fan-out wiring 720*a* and only the first additional conductive layer 215*d*' and/or the second additional conductive layer 215*d*" may be arranged in a part of the bending area BA.

The insulating layers 180 (see FIG. 4H) may be arranged between layers of each of the first additional conductive layers 215*d*', the second additional conductive layers 215*d*", and the fan-out wirings 720*a*.

FIGS. 5A through 5I are cross-sectional views schematically illustrating a portion of a display apparatus according to an exemplary embodiment. In particular, FIGS. 5A to 5G are cross-sectional view that illustrate a region near the bending area BA.

Figure 5A:
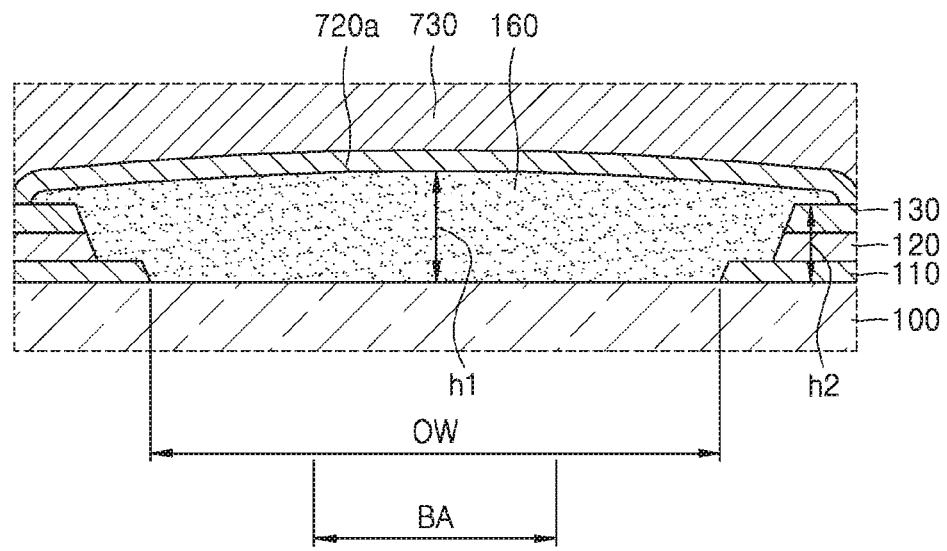
FIG. 5A is a cross-sectional view schematically illustrating a portion of a display apparatus according to an exemplary embodiment.

Referring to FIG. 5A, a height h1 of at least a portion of the organic material layer 160 in the opening of the inorganic insulating layer may be greater than a height h2 of the inorganic insulating layer. As shown in FIG. 5A, a height of a central portion of the organic material layer 160 may be greater than the heights at both ends of the opening. The organic material layer 160 may cover the inner surface of the opening such that a short circuit does not occur between the fan-out wiring 720*a* and a conductive material remaining on the inner surface of the opening.

Figure 5B:
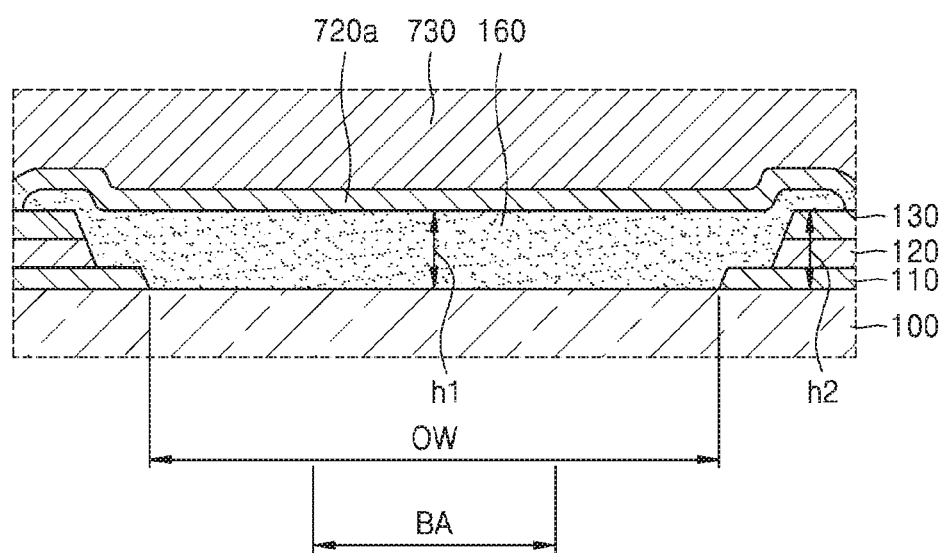
FIG. 5B is a cross-sectional view schematically illustrating a portion of a display apparatus according to an exemplary embodiment.

Referring to FIG. 5B, the height h1 of the organic material layer 160 in the opening of the inorganic insulating layer may be substantially a height h2 of the inorganic insulating layer. In this case, the organic material layer 160 may cover the inner surface of the opening such that a short does not occur between the fan-out wiring 720*a* and the conductive material remaining on the inner surface of the opening. The height h1 of the organic material layer 160 may vary depending on tensile stress due to the bending.

Figure 5C:
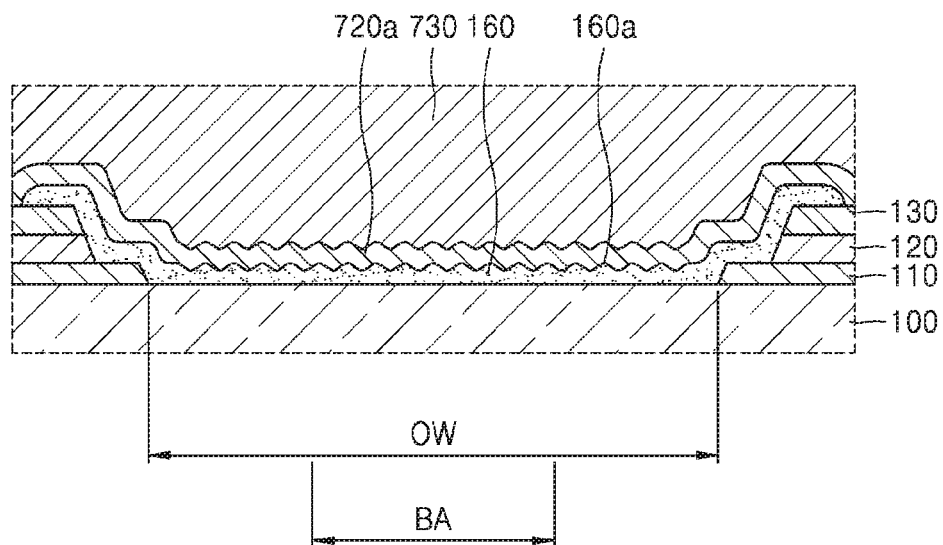
FIG. 5C is a cross-sectional view schematically illustrating a portion of a display apparatus according to an exemplary embodiment.

Referring to FIG. 5C, at least a portion of an upper surface (in a +z direction) of the organic material layer 160 in the opening of the inorganic insulating layer may have some degree of surface unevenness. Accordingly, a surface area of an upper surface of the organic material layer 160 and surface areas of upper and lower surfaces of the fan-out wiring 720*a* in the opening may increase. The surface area increase of the upper surface of the organic material layer 160 and the upper and lower surfaces of the fan-out wiring 720*a* may denote that a deformation margin increases in order to reduce tensile stress due to the bending of the substrate 100.

Since the fan-out wiring 720a is on the organic material layer 160, the lower surface of the fan-out wiring 720a may be shaped to correspond to unevenness surfaces 160a of the organic material layer 160.

The unevenness surfaces 160a of the upper surface (in the +z direction) of the organic material layer 160 may be formed by using various methods. For example, a photosensitive material may be used when forming the organic material layer 160, and during the manufacturing process, the amount of light exposure may be differentiated by using a slit mask or a halftone mask in various portions of the organic material layer 160 that still have a substantially flat upper surface. Thus, a certain portion may be relatively more etched (removed) than other portions. The portion that is relatively more etched may be a portion that is concave with respect to the upper surface of the organic material layer 160. Methods of manufacturing the display apparatus according to the present exemplary embodiment are not limited to the aforementioned method. For example, dry etching a certain portion after forming the organic material layer 160 with a substantially flat upper surface, or other various methods may be used.

Figure 5D:
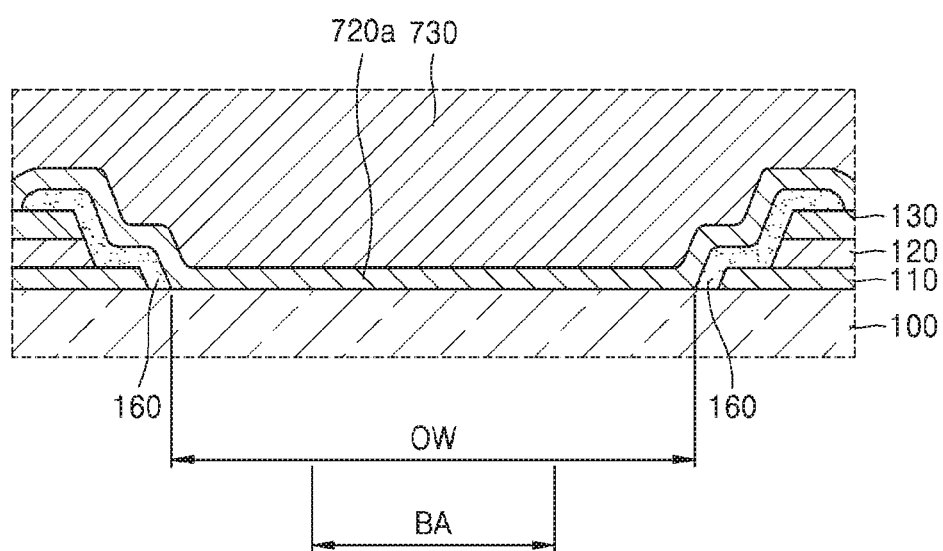
FIG. 5D is a cross-sectional view schematically illustrating a portion of a display apparatus according to an exemplary embodiment.

Referring to FIG. 5D, the organic material layer 160 may cover the inner surface of the opening and extend to a portion of an upper surface of the inorganic insulating layer. In an exemplary embodiment, the organic material layer 160 may not be disposed in at least a portion of the central portion of the opening. The organic material layer 160 may cover the inner surface of the opening to prevent a short between the fan-out wiring 720a and a conductive material remaining on the inner surface of the opening. According to the present exemplary embodiment, since there is no inorganic insulating layer in the bending area BA, there is a lower probability of the formation of fractures in the fan-out wiring 720a.

Figure 5E:
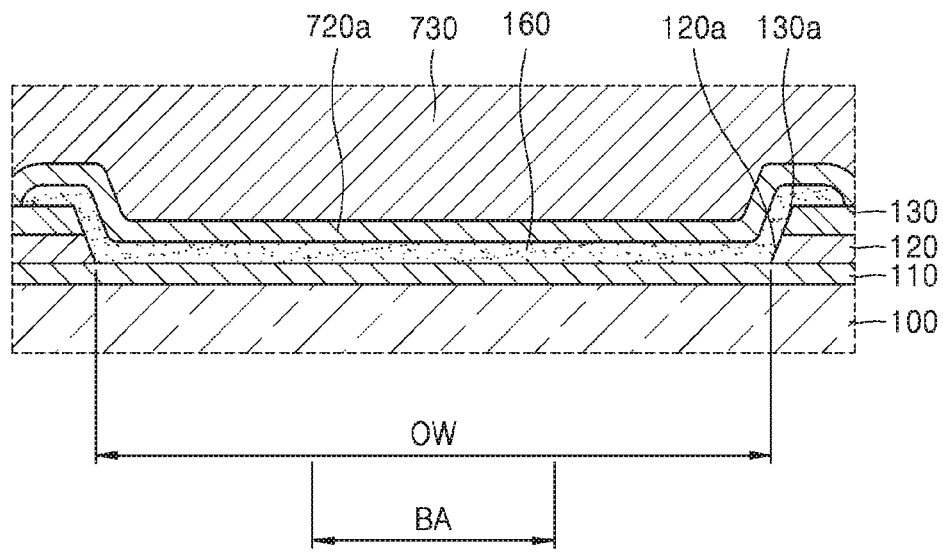
FIG. 5E is a cross-sectional view schematically illustrating a portion of a display apparatus according to an exemplary embodiment.

Referring to FIG. 5E, the inorganic insulating layer may have a groove in the bending area BA instead of an opening that exposes the substrate 100. In other words, only a portion of the inorganic insulating layer, i.e., only a portion of the buffer layer 110, the gate insulating layer 120, and the interlayer insulating layer 130, may be removed in the bending area BA. For example, the buffer layer 110 may continue across the first area 1A, the bending area BA, and the second area 2A. Also, the gate insulating layer 120 may have an opening 120a corresponding to the bending area BA, and the interlayer insulating layer 130 may have an opening 130a corresponding to the bending area BA. Accordingly, the inorganic insulating layer, which includes the buffer layer 110, the gate insulating layer 120, and the interlayer insulating layer 130, may have a groove corresponding to the bending area BA. The inorganic insulating layer may have a groove with a different shape from the description above. For example, an upper surface (in the +z direction) of the buffer layer 110 may be partially removed, but a lower surface (in the −z direction) of the gate insulating layer 120 may not be removed and maintained.

In the display apparatus according to the present exemplary embodiment, the organic material layer 160 may fill at least a portion of the groove. The forming of the groove in the inorganic insulating layer may decrease the possibility of cracks in the inorganic insulating layer, and thus decrease the probability of fractures spreading to the fan-out wiring 720a. Although the organic material layer 160 may block the spreading of the fractures, the forming of the groove in the inorganic insulating layer may further reduce the probability of the formation of fractures in the inorganic insulating layer. Accordingly, a lower level of tensile stress may concentrate on the fan-out wiring 720a.

Figure 5F:
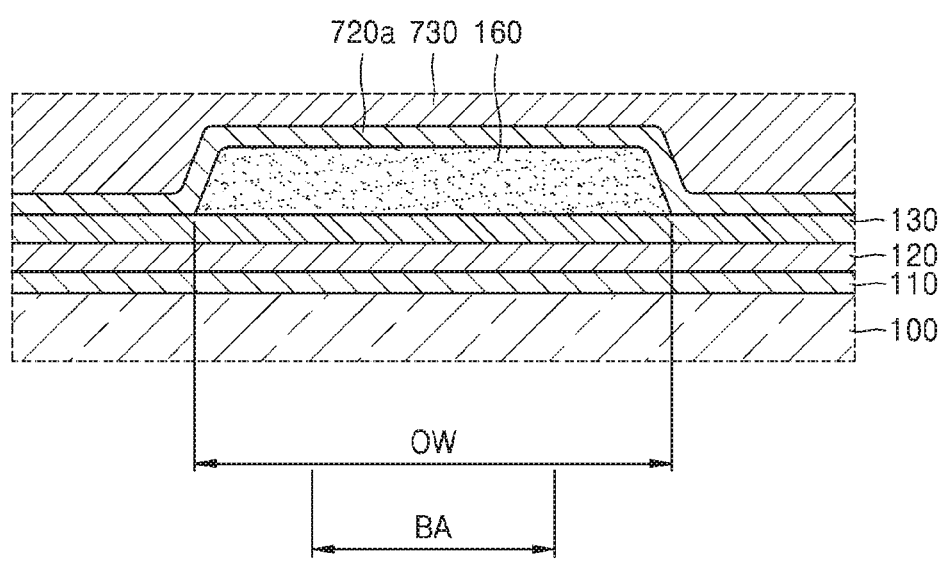
FIG. 5F is a cross-sectional view schematically illustrating a portion of a display apparatus according to an exemplary embodiment.

Referring to FIG. 5F, the inorganic insulating layer may not have an opening or a groove in the bending area BA, and the organic material layer 160 may be on the inorganic insulating layer. That is, the inorganic insulating layer may not have an opening in the bending area BA. The organic material layer 160 may absorb the tensile stress of the inorganic insulating layer to reduce the amount of tensile stress transmitted to the fan-out wiring 720a. A height of the organic material layer 160 may vary.

Figure 5G:
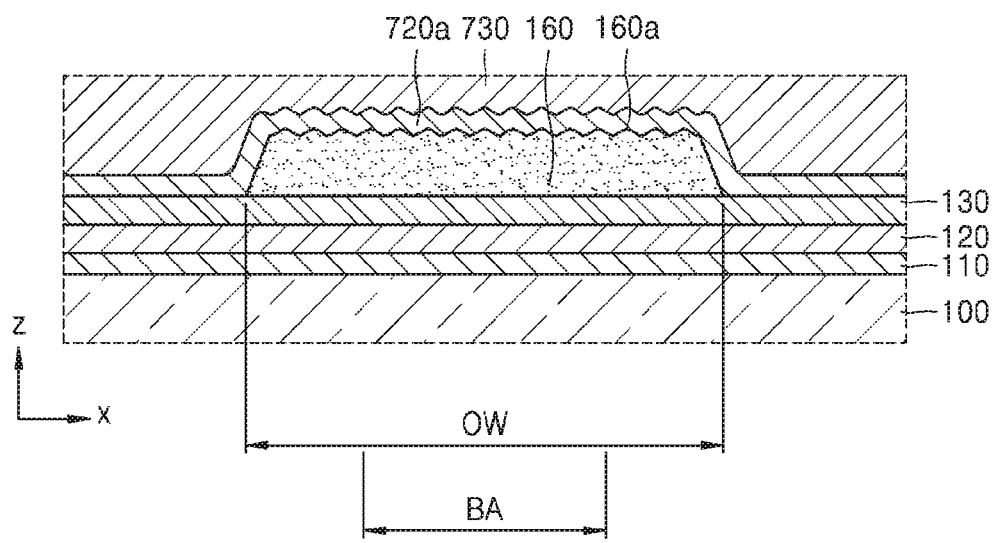
FIG. 5G is a cross-sectional view schematically illustrating a portion of a display apparatus according to an exemplary embodiment.

Referring to FIG. 5G, the inorganic insulating layer may not have an opening or a groove in the bending area BA, and the organic material layer 160 may be on the inorganic insulating layer. Also, at least a portion of the upper surface (in the +z direction) of the organic material layer 160 may have unevenness surfaces. Accordingly, the surface area of the upper surface of the organic material layer 160 and the surface areas of the upper and lower surfaces of the fan-out wiring 720a in the opening may increase. The surface area increase of the upper surface of the organic material layer 160 and the upper and lower surfaces of the fan-out wiring 720a may denote that a deformation margin increases in order to reduce the level of tensile stress due to the bending of the substrate 100.

Figure 5H:
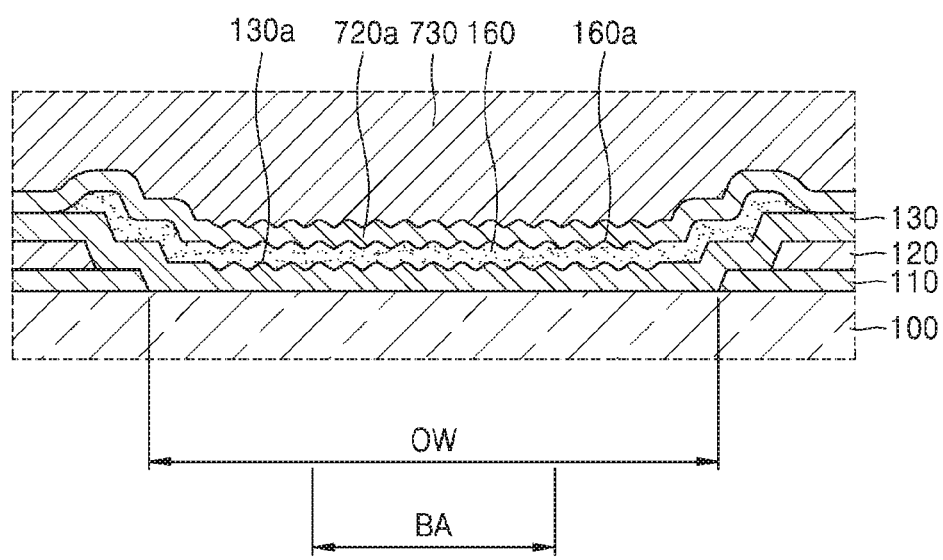
FIG. 5H is a cross-sectional view schematically illustrating a portion of a display apparatus according to an exemplary embodiment.

Referring to FIG. 5H, the buffer layer 110, the gate insulating layer 120, or the interlayer insulating layer 130 may have surface unevenness in the bending area BA. In FIG. 5H, the interlayer insulating layer 130 may have surface unevenness 130a but the present invention is not limited thereto. For example, at least one of the buffer layer 110, the gate insulating layer 120, and the interlayer insulating layer 130 that are present in the bending area BA and another insulating layer may have surface unevenness.

As shown in FIG. 5H, the interlayer insulating layer 130 may have surface unevenness 130a, and thus, shapes of upper surfaces and/or lower surfaces of the organic material layer 160 and the fan-out wiring 720a that are located above the interlayer insulating layer 130 may correspond to the surface unevenness 130a of the interlayer insulating layer 130. In an exemplary embodiment, the organic material layer 160 may be omitted. Although the organic material layer 160 may be omitted, since the fan-out wiring 720a has an unevenness quality to it, an amount of tensile stress may be minimized. As described above, when the substrate 100 is bent in the bending area BA during a manufacturing process, since tensile stress is applied to the fan-out wiring 720a, a shape of an upper surface and/or a lower surface of the fan-out wiring 720a may correspond to the surface unevenness 130a, thereby applying less tensile stress to the fan-out wiring 720a.

Figure 5I:
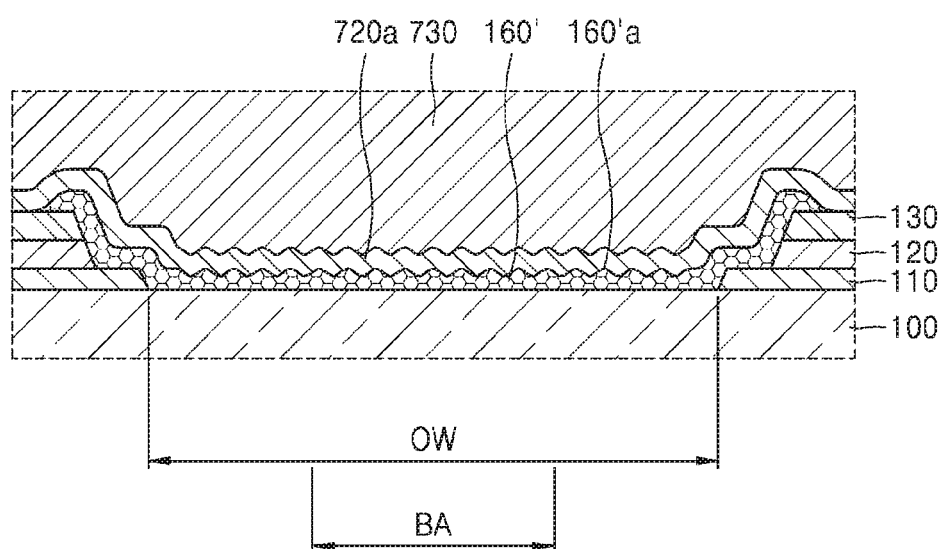
FIG. 5I is a cross-sectional view schematically illustrating a portion of a display apparatus according to an exemplary embodiment.

Referring to FIG. 5I, the display apparatus according to an exemplary embodiment may include an inorganic material layer 160' arranged between the fan-out wiring 720a and the substrate 100 in the bending area BA, instead of the organic material layer 160. When the inorganic material layer 160' is applied, the inorganic material layer 160' may include the same material as the first inorganic encapsulation layer 410, the second inorganic encapsulation layer 430, the touch buffer layer 610, the first insulating layer 712, or the second insulating layer 714. If the planarization layer 140 or the pixel defining layer 150 may include an inorganic material, the inorganic material layer 160' may include the same material as the planarization layer 140 or the pixel defining layer 150.

At least a part of an upper surface of the inorganic material layer 160' (in the +z direction) may have surface unevenness 160'a. Accordingly, a surface area of the upper surface of the inorganic material layer 160' and surface areas of upper and lower surfaces of the fan-out wiring 720a in an opening may increase. This may mean that a deformation margin increases in order to reduce tensile stress due to the bending of the substrate 100.

Figure 5J:
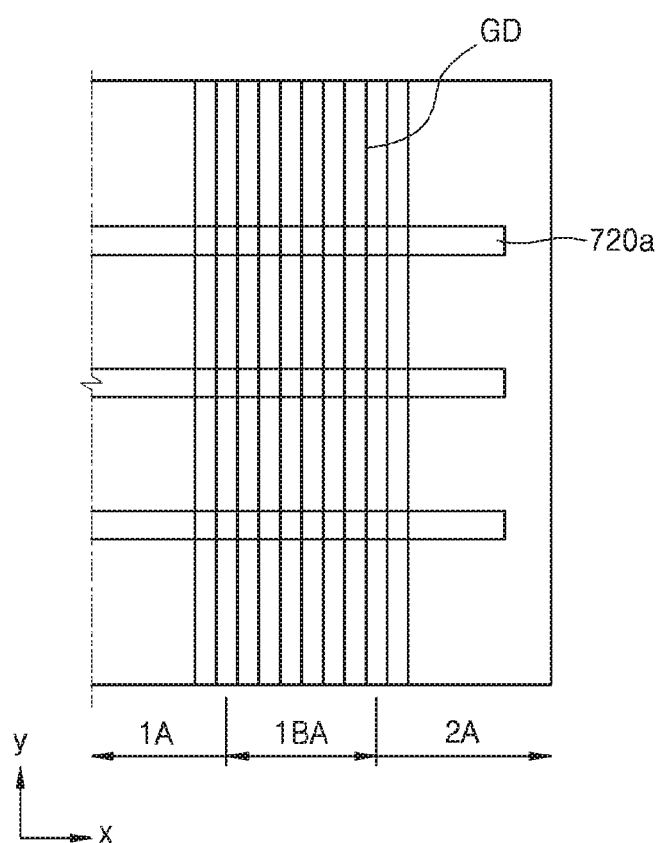
FIG. 5J is a plan view schematically illustrating a portion of a display apparatus according to an exemplary embodiment.
Figure 5K:
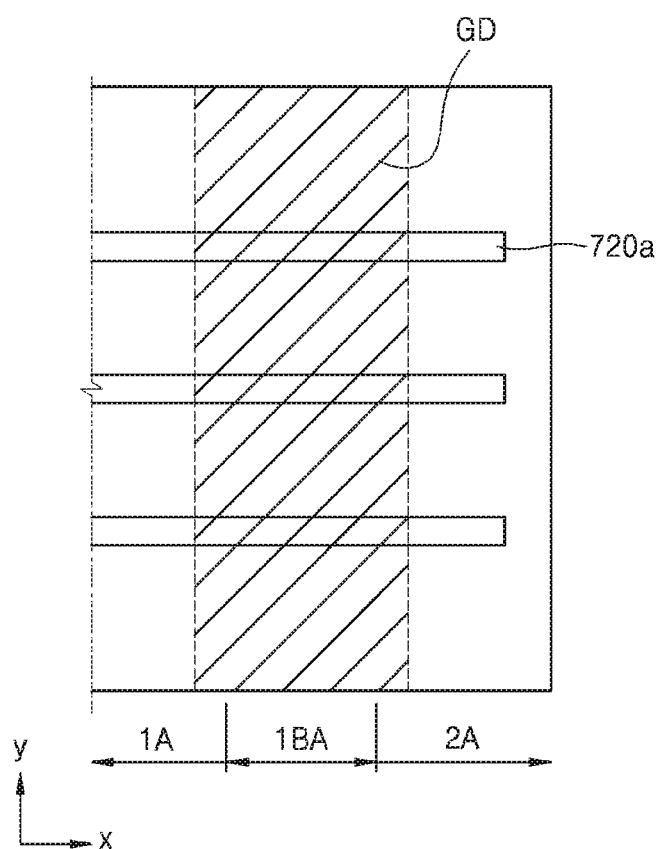
FIG. 5K is a plan view schematically illustrating a portion of a display apparatus according to an exemplary embodiment.

In the exemplary embodiments described above, the surface unevenness 160a may be formed by extending protrusion surfaces in a certain direction. In some exemplary embodiments, the fan-out wiring 720a may extend in a second direction (+x direction), and protrusion surfaces of the surface unevenness 160a may extend in a first direction (+y direction) so that the protrusion surfaces of the fan-out wiring 720a and the surface unevenness 160a may intersect with each other. An intersection angle may be 90 degrees, as shown in FIG. 5J, which is a plan view schematically illustrating a portion of a display apparatus according to another exemplary embodiment and may be an angle other than 90 degrees as shown in FIG. 5K. For reference, reference numeral GD of FIGS. 5J and 5K may denote a direction in which protrusion surfaces of the unevenness surfaces 160a formed in an upper surface of the organic material layer 160 extend. In FIG. 5J, the direction in which protrusion surfaces of the surface unevenness 160a formed in the upper surface of the organic material layer 160 extend inclines with respect to the second direction (+x direction) compared to FIG. 5K, but the exemplary embodiments are not limited thereto. For example, as shown in FIG. 5K, the direction in which protrusion surfaces of the surface unevenness 160a formed in the upper surface of the organic material layer 160 extend may be the first direction (+y direction), and a direction in which the fan-out wiring 720a extends may not be the second direction (+x direction) but may be an inclined direction (for example, a direction forming 45 degrees with respect to the second direction (+x direction)) with respect to the second direction (+x direction). When a plurality of fan-out wirings 720a present, angles formed by some of the plurality of fan-out wirings 720a with respect to the second direction (+x direction) may be different from angles formed by others of the plurality of fan-out wirings 720a with respect to the second direction (+x direction).

Figure 6A:
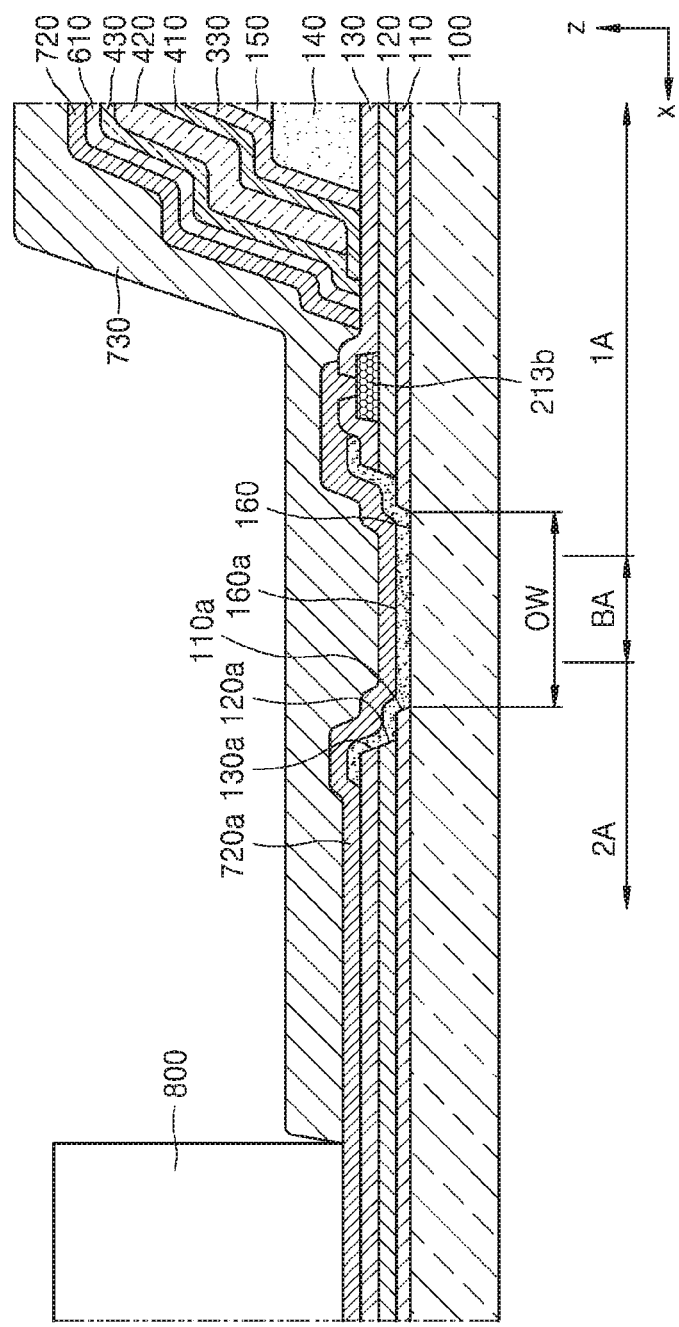
FIG. 6A is a cross-sectional view schematically illustrating a portion of a display apparatus according to an exemplary embodiment.
Figure 6B:
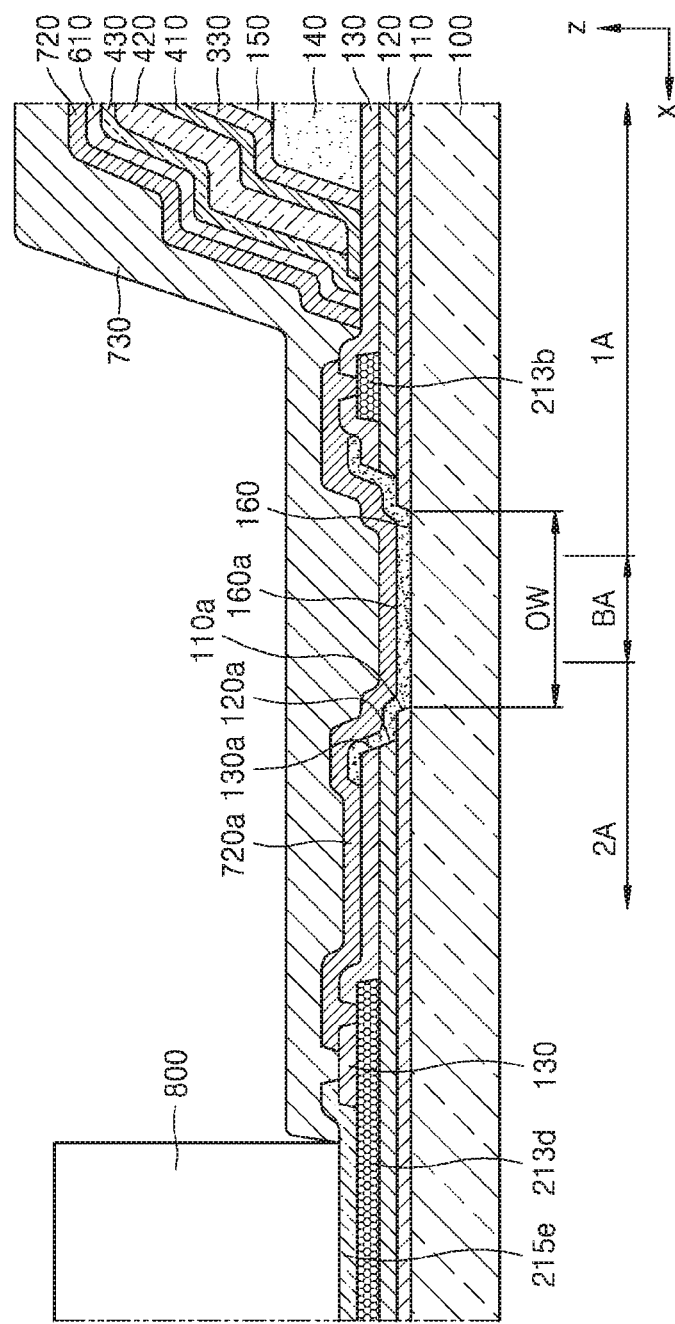
FIG. 6B is a cross-sectional view schematically illustrating a portion of a display apparatus according to an exemplary embodiment.

FIGS. 6A and 6B are cross-sectional views schematically illustrating a portion of a display apparatus according to exemplary embodiments. In particular, the drawings schematically illustrate an area near an end of the fan-out wiring 720a.

Referring to FIG. 6A, a driving circuit 800 may be provided at one end of the fan-out wiring 720a. The driving circuit 800 may be electrically connected to the first, second, and third signal wirings 213b, 213c, and 215c through the fan-out wiring 720a to provide driving signals to the display area DA. The driving signals indicate various signals for driving the display apparatus, such as driving voltages, gate signals, data signals, or the like.

Referring to FIG. 6B, the fan-out wiring 720a may be connected to a lower fan-out wiring 213d in the second area 2A. The lower fan-out wiring 213d may be disposed on the gate insulating layer 120, and simultaneously formed with the gate electrode 213 by using the same material as the gate electrode 213. The fan-out wiring 720a may be connected to the lower fan-out wiring 213d via a contact hole. The upper fan-out wiring 215e may be additionally located at an end of the lower fan-out wiring 213d. The upper fan-out wiring 215e may be simultaneously formed with the source electrode 215a or the drain electrode 215b by using the same material as the source electrode 215a or the drain electrode 215b. Alternatively, the upper fan-out wiring 215e may be simultaneously formed with the fan-out wiring 720a by using the same material as the fan-out wiring 720a.

Various modifications may be implemented. For example, the lower fan-out wiring 213d or the upper fan-out wiring 215e may be omitted.

The driving circuit 800 may be provided at an end of the upper fan-out wiring 215e or an end of the lower fan-out wiring 213d. The driving circuit 800 may be electrically connected to the first, second, and third signal wirings 213b, 213c, and 215c through the upper fan-out wiring 215e or the lower fan-out wiring 213d, and the fan-out wiring 720a to provide driving signals to the display area DA. The driving signals indicate various signals for driving the display apparatus, such as driving voltages, gate signals, data signals, or the like.

FIGS. 7A through 7I are cross-sectional views sequentially illustrating a method of manufacturing a display apparatus, according to an exemplary embodiment. Here, a method of manufacturing the display apparatus of FIG. 2C will be described as an example.

Figure 7A:
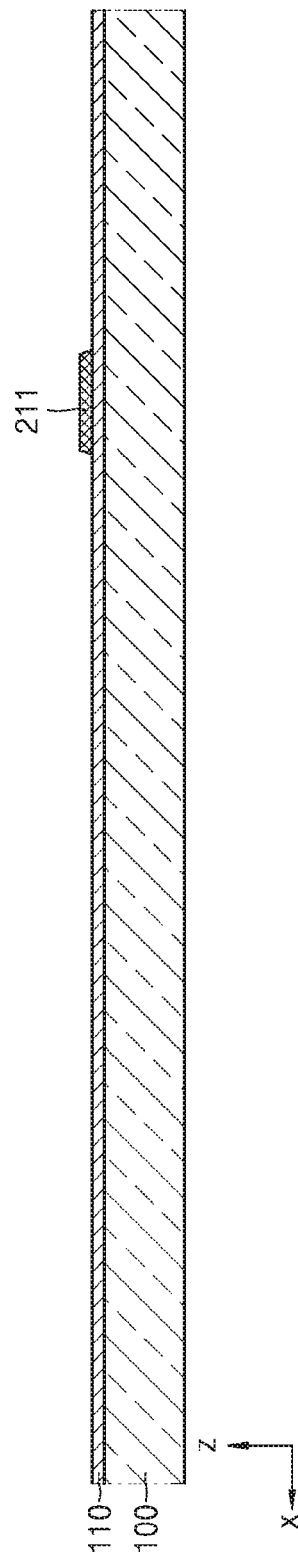
FIG. 7A, FIG. 7B, FIG. 7C, FIG. 7D, FIG. 7E, FIG. 7F, FIG. 7G, FIG. 7H, and FIG. 7I are cross-sectional views sequentially illustrating a method of manufacturing a display apparatus, according to an exemplary embodiment.

Referring to FIG. 7A, the buffer layer 110 and a semiconductor material layer are sequentially stacked on the substrate 100. Then, the semiconductor layer 211 is formed by patterning the semiconductor material layer.

The substrate 100 may include various flexible or bendable materials, for example, a polymer resin such as PES, PAR, PEI, PEN, PET, PPS, polyarylate, PI, PC, or CAP.

First, the buffer layer 110 and a semiconductor material may be deposited on an entire area of the substrate 100. The buffer layer 110 may include an inorganic material such as silicon oxide, silicon nitride, and/or silicon oxynitride. The semiconductor material layer may be formed as a semiconductor including non-amorphous silicon, polycrystalline silicon, an organic semiconductor material, or the like. The buffer layer 110 and the semiconductor material layer may be deposited by using various deposition methods.

Next, the semiconductor layer 211 may be formed by forming a photo resist pattern on the semiconductor material layer by using a mask and then patterning the semiconductor material layer.

Figure 7B:
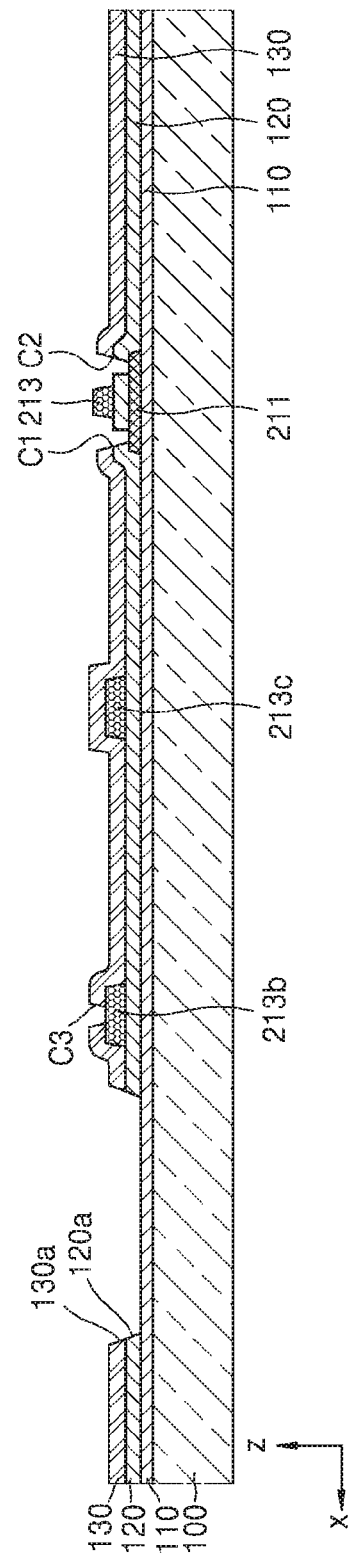

Referring to FIG. 7B, the gate insulating layer 120 that covers the semiconductor layer 211 is formed on the entire area of the substrate 100, and a first conductive material layer is deposited on the gate insulating layer 120. The photo resist pattern is formed on the first conductive material layer by using a mask, and then the first conductive material layer is patterned to thus form the gate electrode 213, the first signal wiring 213b, and the second signal wiring 213c. The gate electrode 213 may overlap the semiconductor layer 211.

The gate insulating layer 120 may include an inorganic material such as silicon oxide, silicon nitride, and/or silicon oxynitride, and may be deposited by using various deposition methods.

The first conductive material layer may be formed by using a low-resistive metallic material. For example, the first conductive material layer may include Mo, Al, Cu, and/or Ti. The first conductive material layer may be a single layer or layers.

The first conductive material layer may be deposited by using various deposition methods. The first conductive material layer may be deposited at a temperature of 90° C. or greater, for example, at a high temperature of 150° C. or above, to improve conductivity and reduce resistivity.

After forming the gate electrode 213, the first signal wiring 213b, and the second signal wiring 213c, the interlayer insulating layer 130 is formed to cover the gate electrode 213, the first signal wiring 213b, and the second signal wiring 213c. The interlayer insulating layer 130 may include an inorganic material such as silicon oxide, silicon nitride, and/or silicon oxynitride, and may be deposited by using various deposition methods.

Next, a photo resist pattern may be formed on the interlayer insulating layer 130 by using a mask, and then the interlayer insulating layer 130 and the gate insulating layer 120 may be simultaneously etched to form contact hole C1 and C2 that expose the semiconductor layer 211, a contact hole C3 that expose the first signal wiring 213b, the opening 130 of the interlayer insulating layer 130 in the non-display area, and the opening 120a of the gate insulating layer 120. The opening 130a of the interlayer insulating layer 130 and the opening 120a of the gate insulating layer 120 may be omitted according to exemplary embodiments.

Figure 7C:
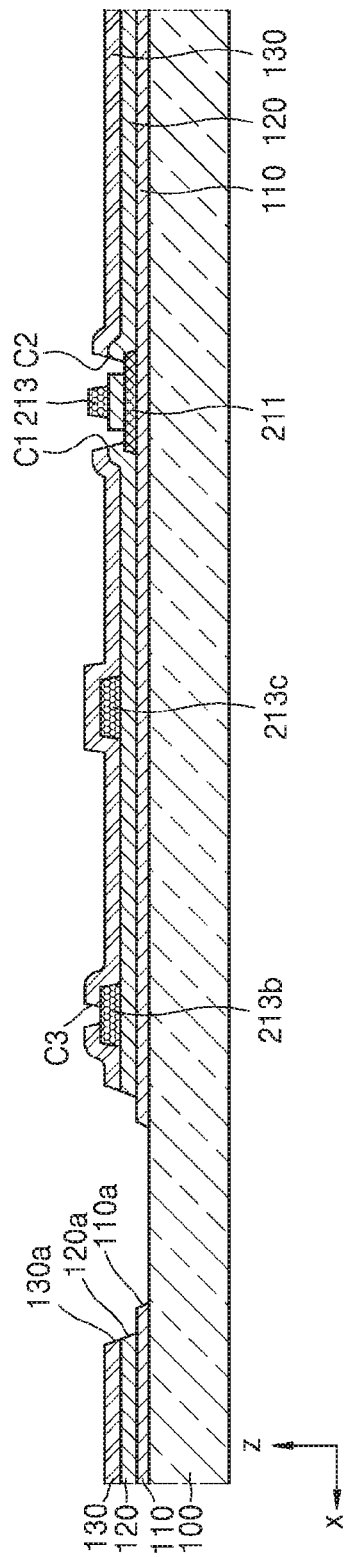

Next, as shown in FIG. 7C, the opening 110a of the buffer layer 110 is formed in the opening 130a of the interlayer insulating layer 130 and the opening 120a of the gate insulating layer 120. The opening 110a of the buffer layer 110 may be formed by using a mask other than the mask used to form the opening 130a of the interlayer insulating layer 130 and the opening 120a of the gate insulating layer 120. The semiconductor layer 211 may be damaged when the opening 110a of the buffer layer 110 is formed at the same time as the opening 130a of the interlayer insulating layer 130 and the opening 120a of the gate insulating layer 120.

Figure 7D:
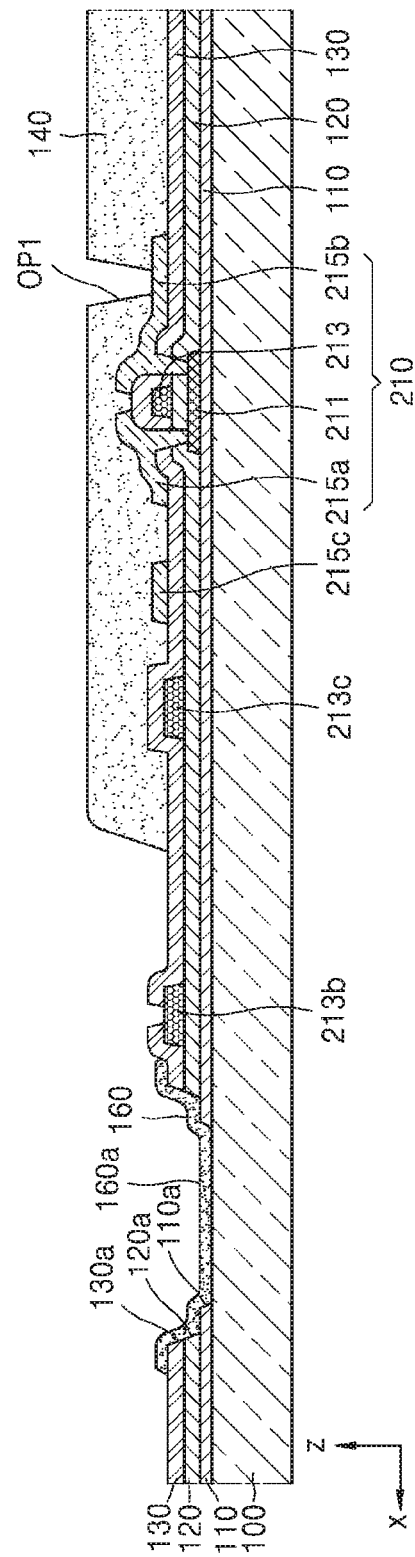

Referring to FIG. 7D, the source electrode 215a, the drain electrode 215b, and the third signal wiring 215c are formed by depositing a second conductive material layer on the interlayer insulating layer 130, forming a photo resist pattern on the second conductive material layer by using a mask, and patterning the second conductive material. The source electrode 215a and the drain electrode 215b may be respectively connected to a source area and a drain area of the semiconductor layer 211 via the contact holes C1 and C2 that expose the semiconductor layer 211. According to an exemplary embodiment, the source area and the drain area may be formed by doping.

The second conductive material layer may be formed by using a low-resistive metallic material. For example, the second conductive material layer may include Al, Cu, and/or Ti. The second conductive material layer may be a single layer or layers.

The second conductive material layer may be deposited by using various deposition methods. The second conductive material layer may be deposited at a temperature of 90° C. or above, for example, at a high temperature of 150° C. or above, to improve conductivity and reduce resistivity.

Next, the substrate 100 may be coated or deposited with a first organic material, and the planarization layer 140 and the organic material layer 160 are simultaneously formed by a masking process. By simultaneously forming the planarization layer 140 and the organic material layer 160, additional mask processes for forming the organic material layer 160 may be unnecessary.

The first organic material may be an organic material such as PI, acryl, BCB, or HMDSO. The first organic material may be a photosensitive organic material. Accordingly, the planarization layer 140 and the organic material layer 160 may be formed by using a mask to partially expose light, developing, and curing. Respective heights of the planarization layer 140 and the organic material layer 160 may be different from one another. This is because the amount of light exposure may be differentiated by using a slit mask or a halftone mask so that a certain portion is relatively more removed than other portions. The planarization layer 140 may include an opening OP1 that exposes the source electrode 215a or the drain electrode 215b.

The organic material layer 160 may be not formed at the same time as the planarization layer 140, but be formed at the same time as the pixel defining layer 150 or the organic encapsulation layer 420 of the encapsulation layer 400. Other various methods may also be used to form the organic material layer 160.

Figure 7E:
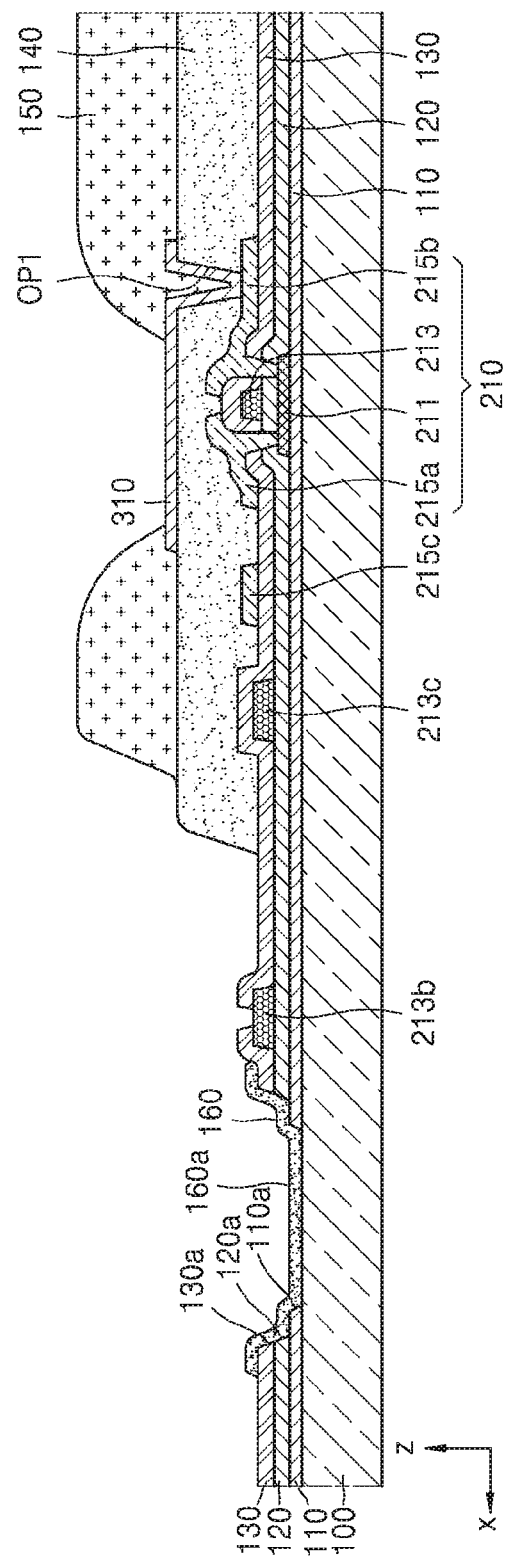

Referring to FIG. 7E, the pixel electrode 310 is formed by depositing a third conductive material on the planarization layer 140, forming a photo resist pattern on the third conductive material layer by using a mask, and etching the third conductive material. The pixel electrode 310 may fill the opening OP1 of the planarization layer 140, and may be connected to the source electrode 215a or the drain electrode 215b.

The third conductive material may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). Other than the transparent conductive oxide, the third conductive material may further include a metallic reflection film including one or more selected from silver (Ag), magnesium (Mg), aluminum (Al), platinum (Pt), lead (Pb), gold (Au), nickel (Ni), neodymium (Nd), iridium (Ir), and chrome (Cr).

Next, a second organic material is formed on the entire surface of the substrate 100 to cover the pixel electrode 310. The second organic material may be an organic material such as PI, acryl, BCB, or HMDSO. The second organic material may be a photosensitive organic material. Accordingly, the pixel defining layer 150 that exposes a central portion of the pixel electrode 310 may be formed by using a mask to partially expose light, developing, and curing.

The pixel defining layer 150 and the planarization layer 140 may have a stair-step structure at a peripheral area outside the display area DA. Therefore, when the peripheral area outside the display area DA may be formed as a gradually curved stair-step by the organic materials.

As described above, the organic material layer 160 may be formed at the same time as the pixel defining layer 150.

Figure 7F:
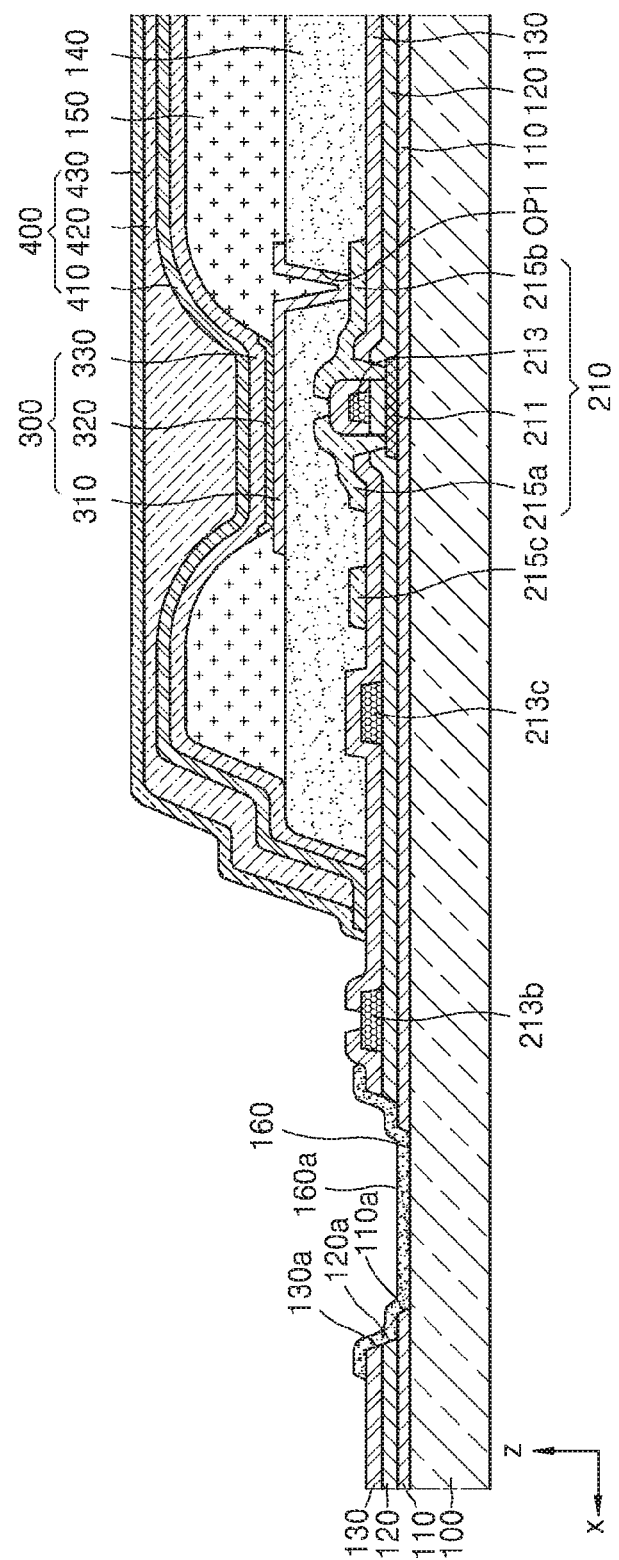

Referring to FIG. 7F, the display device 300 is formed by forming the intermediate layer 320 of the organic light-emitting device in an area where the pixel electrode 310 is not covered by the pixel defining layer 150, and then forming the opposite electrode 330 on the intermediate layer 320. The opposite electrode 330 may extend to an upper portion of the pixel defining layer 150.

The intermediate layer 320 may include a low molecular material or a high molecular material. When the intermediate layer 320 includes a low molecular material, the intermediate layer 320 may include an EML, and may further include at least one of a HIL, a HTL, an ETL, and an EIL. The intermediate layer 320 may include various organic materials, for example, CuPc, NPB, $Alq_3$, or the like. The layers may be formed by vapor deposition.

When the intermediate layer 320 includes a high molecular weight material, the intermediate layer 320 may include an HTL and an EML. The HTL may include PEDOT, and the EML may include PPV-based and polyfluorene-based high molecular weight materials. The intermediate layer 320 may be formed by screen printing, inkjet printing, LITI, or the like.

The opposite electrode 330 may include various conductive materials. For example, the opposite electrode 330 may include a transparent conductive metallic oxide selected from the group consisting of ITO, IZO, ZnO, $In_2O_3$, IGO, and AZO. According to another exemplary embodiment, the opposite electrode 330 may be formed as a thin film including at least one material selected from lithium (Li), calcium (Ca), LiF/Ca, LiF/Al, aluminum (Al), silver (Ag), magnesium (Mg), and ytterbium (Yb). The opposite electrode 330 may be formed as a single layer or layers. The opposite electrode 330 may be a reflection electrode in a bottom emission type display apparatus. The opposite electrode 330 may be a transparent or a semi-transparent electrode in a top emission type display apparatus.

The opposite electrode 330 may be formed by using various deposition methods, for example, sputtering, vacuum deposition, CVD, pulse laser deposition, printing, atomic layer deposition, and the like.

Next, the encapsulation layer 400 is formed to encapsulate the display area. The encapsulation layer 400 may include at least one organic encapsulation layer and at least one inorganic encapsulation layer. The encapsulation layer 400 is formed to cover the display area, in the order of the first inorganic encapsulation layer 410, the organic encapsulation layer 420, and the second inorganic encapsulation layer 430. The periphery of the second inorganic encapsulation layer 430 outside the display area DA may contact the first inorganic encapsulation layer 410 so that the organic encapsulation layer 420 is not externally exposed.

Each of the first inorganic encapsulation layer 410 and the second inorganic encapsulation layer 430 may include silicon oxide, silicon nitride, and/or silicon oxynitride. The first inorganic encapsulation layer 410 and the second inorganic encapsulation layer 420 may be deposited by using various deposition methods, for example, CVD, ALD, and sputtering.

The organic encapsulation layer 420 may include at least one selected from the group consisting of PET, PEN, PC, PI, PES, POM, polyarylate, and HMDSO. The second inorganic encapsulation layer 430 may cover the organic encapsulation layer 420, and include silicon oxide, silicon nitride, and/or silicon oxynitride. The organic encapsulation layer 420 may be coated or deposited by flash evaporation, inkjet printing, slot die coating, or the like.

Figure 7G:
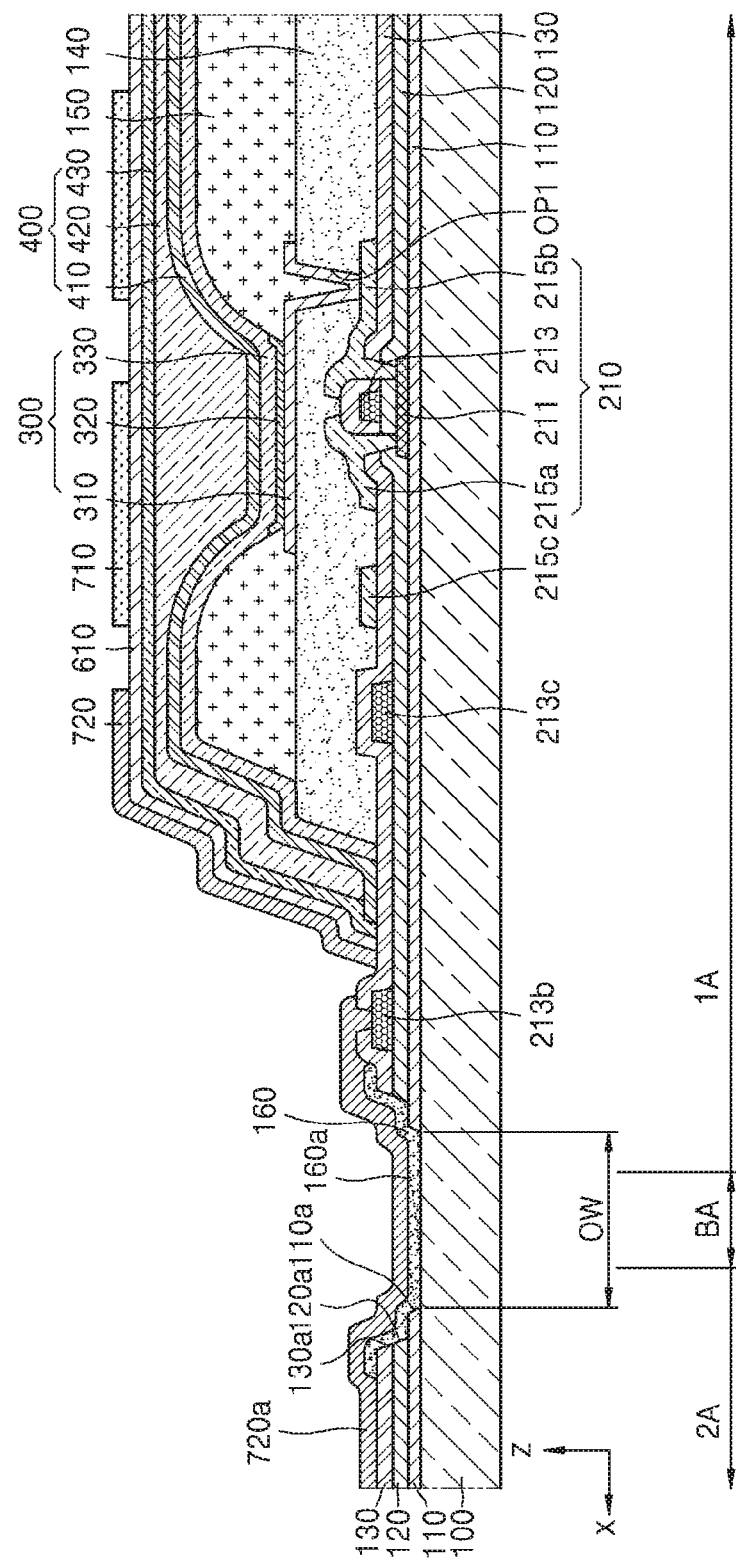

Referring to FIG. 7G, the touch buffer layer 610 is formed on the encapsulation layer 400, and then the touch electrode 710, the touch wire 720, and the fan-out wiring 720a are simultaneously formed.

The touch buffer layer 610 may be formed on the encapsulation layer 400, and may include silicon oxide, silicon nitride, and/or silicon oxynitride. The touch buffer layer 610 may be deposited by using various deposition methods, such as CVD, ALD, or sputtering.

Next, a fourth conductive material layer is formed on the entire surface of the substrate 100. The fourth conductive material layer may include a low-resistive metallic material, for example, Al, Cu, and/or Ti. The fourth conductive material layer may be a single layer or layers.

The fourth conductive material layer may be deposited by using various deposition methods. The fourth conductive material layer may be deposited at a low temperature that does not damage the display device 300 so as to prevent damage to the display device 300 and other elements that are already formed. For example, the fourth conductive material layer may be deposited by a thermal evaporation deposition method at about a temperature of 90° C. or below.

The fourth conductive material layer may be formed with a different material or a different thickness from the first conductive material layer or the second conductive material layer. For example, a thickness of the fourth conductive material layer may be less than a thickness of the second conductive material layer, for example, about 50% of the thickness of the second conductive material layer.

Alternatively, the fourth conductive material layer may be deposited with the same material and the same structure as the second conductive material layer. However, materials that are finally deposited may have different properties because of deposition condition differences.

When deposited at a high temperature of 90° C. or more, for example, about 150° C., the second conductive material layer may have a large grain size and a low resistivity value.

However, the fourth conductive material layer may be deposited at a low temperature less than 90° C., and thus, have a grain size that is smaller than the grain size of the second conductive material layer and a high resistivity value. For example, a resistivity value of the fourth conductive material layer may be about 25% higher than the resistivity value of the second conductive material layer.

The fan-out wiring 720a, the touch wire 720, and the touch electrode 710 may be simultaneously formed by forming a photo resist pattern on the fourth conductive material layer by using a mask and patterning a fourth conductive material.

As described above, the touch electrode 710 may include the first touch conductive layer 711, the first insulating layer 712, the second touch conductive layer 713, and the second insulating layer 714. In this case, the fan-out wiring 720a and the touch wire 720 may be formed at the same time as the first touch conductive layer 711 or the second touch conductive layer 713. In an exemplary embodiment, the fan-out wiring 720a and the touch wire 720 may be formed in the same manner as a stack of the first touch conductive layer 711 and the second touch conductive layer 713. Thus, a first layer may be formed at the same time as the first touch conductive layer 711, and a second layer may be formed at the same time as the second touch conductive layer 713.

Since the fan-out wiring 720a and the touch wire 720 are simultaneously formed, the organic material layer 160 may be formed at the same time as a layer including an organic material provided in the display area DA, which thus simplifies the mask process.

Figure 7H:
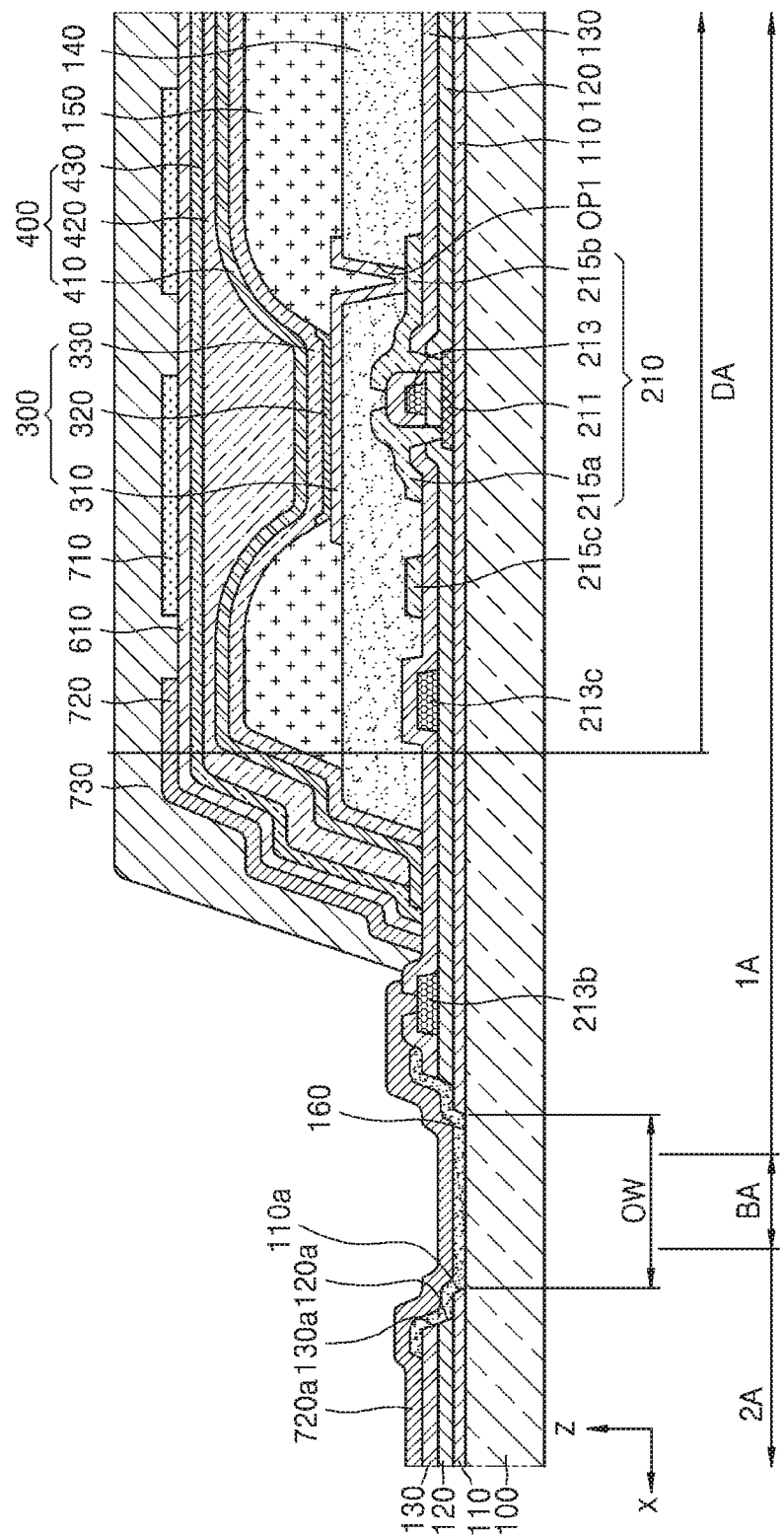

Referring to FIG. 7H, the cover layer 730 is formed on the entire surface of the substrate 100. The cover layer 730 may be flexible, and include polymethyl methacrylate, polydimethylsiloxane, PI, acrylate, PET, PEN, or the like. The cover layer 730 may extend to at least to the bending area BA of the non-display area as a single body.

Figure 7I:
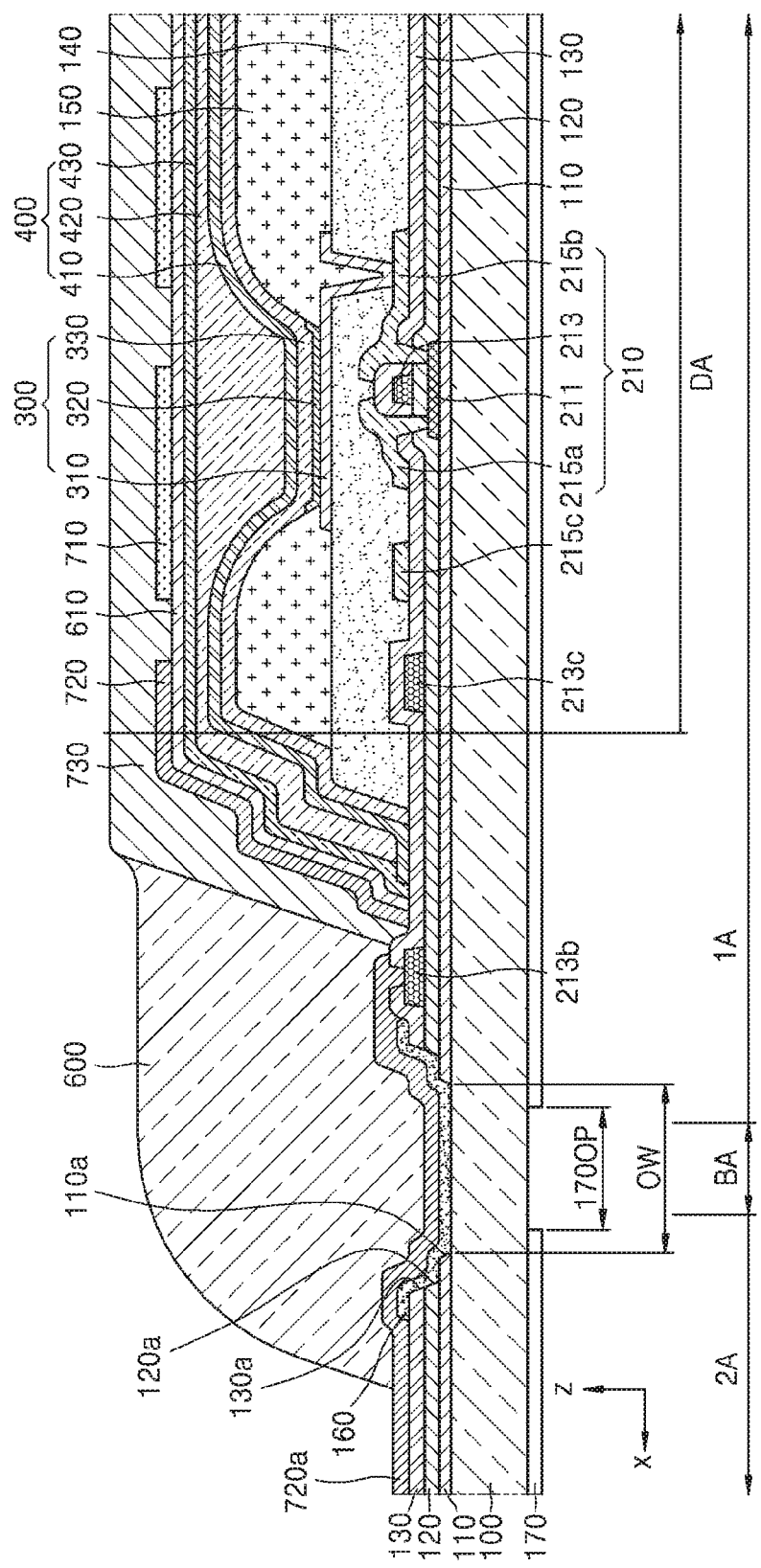

Referring to FIG. 7I, the BPL 600 may be formed in the bending area BA. The BPL 600 may be formed by applying and hardening a liquid phase material or a paste-type material.

Next, the display apparatus may be bent about bending axis BAX of the bending area BA such that the display apparatus is approximately shaped as the display apparatus shown in FIG. 2.

As described above, according to exemplary embodiments, when the display apparatus is bent by using the organic material layer 160 between the fan-out wiring 720a and the substrate 100, the possibility of a short-circuit occurring at the fan-out wiring 720a may be reduced. Also, according to exemplary embodiments, the mask process may be simplified by forming the organic material layer 160 in the same time as a layer including an organic material provided in the display area DA.

According to the aforementioned exemplary embodiments, a display apparatus with increased durability may be manufactured with low manufacturing cost by reducing defects such as short-circuits during manufacturing processes and reducing the number of operations. Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus comprising:
a substrate including a display area in which a display device is disposed and a non-display area arranged around the display area;
an encapsulation layer arranged above the display area;
a touch screen layer disposed on the encapsulation layer corresponding to the display area, the touch screen layer including a touch electrode;
a touch wire disposed at the non-display area, the touch wire connecting to the touch electrode;
a fan-out wiring connected to a signal wiring extending from the display area;
a terminal arranged in one side of the non-display area; and
an organic material layer arranged between the terminal and the display area;
wherein:
at least a portion of the fan-out wiring is arranged on the organic material layer;
at least a portion of the touch wire is arranged on the organic material layer;
the fan-out wiring comprises the same material as the touch wire; and
the organic material layer is disposed apart from an organic material layer in the display area.

2. The display apparatus of claim 1, the touch screen layer further comprises a touch buffer layer interposed between the encapsulation layer and the touch electrode,
wherein the touch buffer layer directly contacts the encapsulation layer.

3. The display apparatus of claim 1, wherein the organic material layer comprises a same material as the touch buffer layer.

4. The display apparatus of claim 1, wherein:
the touch electrode comprises a first touch conductive layer, a first insulating layer, a second touch conductive layer, and a second insulating layer which are sequentially stacked;
the first touch conductive layer is electrically connected to the second touch conductive layer; and
the touch wire comprises a same material as the second touch conductive layer.

5. The display apparatus of claim 4, wherein the organic material layer comprises a same material as the first insulating layer.

6. The display apparatus of claim 1, wherein:
the display device comprises a pixel electrode, an opposite electrode facing the pixel electrode, and an intermediate layer interposed between the pixel electrode and the opposite electrode;
the display apparatus further comprises a pixel defining layer comprising an opening that exposes a central portion of the pixel electrode and defining a pixel area in the display area; and
the organic material layer comprises a same material as the pixel defining layer.

7. The display apparatus of claim 1, wherein:
the encapsulation layer comprises an inorganic encapsulation layer and an organic encapsulation layer; and
the organic material layer comprises a same material as the organic encapsulation layer.

8. The display apparatus of claim 1, further comprising a cover layer covering the touch screen layer and protecting the touch electrode.

9. The display apparatus of claim 8, wherein the cover layer extends from an upper portion of the touch electrode to the bending area and covers at least a part of the fan-out wiring.

10. The display apparatus of claim 1, further comprising an inorganic insulating layer interposed between the substrate and the fan-out wiring,
wherein the inorganic material layer comprises an opening or a groove overlapped the organic material layer.

11. The display apparatus of claim 1, wherein at least part of an upper surface of the organic material layer has surface unevenness.

12. The display apparatus of claim 1, further comprising:
a TFT arranged in the display area or the non-display area and comprising a source electrode, a drain electrode, and a gate electrode; and
an additional conductive layer at least partially arranged in non-display area,
wherein the additional conductive layer is provided in a same layer as the source electrode, the drain electrode, or the gate electrode by using a same material as the source electrode, the drain electrode, or the gate electrode.

13. The display apparatus of claim 1, further comprising:
a first TFT arranged in the display area or the non-display area and comprising a first semiconductor layer, a first source electrode, a first drain electrode, and a first gate electrode;
a second TFT arranged in the display area or the non-display area and comprising a second semiconductor layer, a second source electrode, a second drain electrode, and a second gate electrode;
a first additional conductive layer comprising the same material as the first gate electrode; and
a second additional conductive layer comprising the same material as the second gate electrode,
wherein:
the first gate electrode and the second gate electrode are arranged in different layers; and
at least one of the first additional conductive layer and the second additional conductive layer overlaps the organic material layer.

* * * * *